United States Patent [19]

Rakuljic et al.

[11] Patent Number: 5,691,989
[45] Date of Patent: Nov. 25, 1997

[54] WAVELENGTH STABILIZED LASER SOURCES USING FEEDBACK FROM VOLUME HOLOGRAMS

[75] Inventors: George Anthony Rakuljic, Santa Monica; Amnon Yariv, San Marino; Victor Leyva, Los Angeles; Koichi Sayano, Montebello; Charles E. Tyler, Sunnyvale, all of Calif.

[73] Assignee: Accuwave Corporation, Santa Monica, Calif.

[21] Appl. No.: 122,711

[22] Filed: Sep. 14, 1993

Related U.S. Application Data

[63] Continuation-in-part of Ser. No. 991,571, Dec. 16, 1992, Pat. No. 5,491,570, which is a continuation-in-part of Ser. No. 965,746, Oct. 23, 1992, Pat. No. 5,335,098, which is a continuation-in-part of Ser. No. 908,298, Jul. 2, 1992, Pat. No. 5,440,669, which is a continuation-in-part of Ser. No. 736,736, Jul. 26, 1991, abandoned.

[51] Int. Cl.$^6$ ............................... G02B 5/32; G03H 1/26
[52] U.S. Cl. ............................... 372/20; 372/102; 359/15; 359/22
[58] Field of Search ..................... 359/15, 22; 283/86; 372/4, 5, 20, 21, 28, 32, 102

[56] References Cited

U.S. PATENT DOCUMENTS

| | | |
|---|---|---|
| 3,383,664 | 5/1968 | Chen et al. . |
| 3,512,879 | 5/1970 | Reynolds et al. . |
| 3,544,189 | 12/1970 | Chen et al. . |
| 3,627,400 | 12/1971 | Caulfield . |
| 3,703,328 | 11/1972 | Glass et al. . |
| 3,773,400 | 11/1973 | Amodei et al. . |
| 3,799,642 | 3/1974 | Phillips et al. . |
| 3,873,179 | 3/1975 | Burke . |
| 3,912,391 | 10/1975 | Fleisher et al. . |
| 3,915,549 | 10/1975 | Amodei et al. . |
| 3,932,299 | 1/1976 | Phillips . |
| 3,933,504 | 1/1976 | Phillips et al. . |
| 3,997,350 | 12/1976 | Ikeo . |
| 4,052,119 | 10/1977 | Williams et al. . |
| 4,062,618 | 12/1977 | Steensma . |

(List continued on next page.)

FOREIGN PATENT DOCUMENTS

| | | |
|---|---|---|
| 0 001 714 | 5/1979 | European Pat. Off. . |
| 0 284 908 | 10/1988 | European Pat. Off. . |
| 2132281 | 6/1974 | Germany . |
| 2 226 127 | 6/1990 | United Kingdom . |

OTHER PUBLICATIONS

Carracosa, M., "Theoretical Modeling of the Fixing and Developing of Holographic Gratings in LiNbO$_3$," *Optical Society of America*, vol. 7, No. 12, Dec. 1990, see entire document.

Muller, R., "Determination of H Concentration in LiNbO$_3$ by Photorefractive Fixing," *Applied Physics Letters*, vol. 60, No. 26, Jun. 29, 1992, see entire document.

WO,A, 93/11589, PCT Publication (Honeywell Inc.), Jun. 10, 1993.

Patent Abstracts of Japan, vol. 9, No. 113, (P356) May 17, 1985 & JP,A,60 000 424, (Kitagawa Shiyunji) Jan. 5, 1985.

Applied Spectroscopy, vol. 39, No. 4, 1985, Baltimore US, pp. 582–586, W.B. Whitten et al., "Molecular Spectrometry with a Holographically Scanned CW Dye Laser and Supersonic Cooling".

(List continued on next page.)

*Primary Examiner*—Nelson Moskowitz
*Attorney, Agent, or Firm*—Merchant, Gould, Smith, Edell, Welter & Schmidt

[57] ABSTRACT

A laser utilizes feedback from a volume holographic grating used as a wavelength standard to lock the laser output wavelength to its desired value. This feedback can be non-optical, wherein the holographic filter output is used to actively control the wavelength through an external control mechanism. This feedback can also be optical, wherein a volume hologram reflection grating is used to generate optical feedback into the laser gain.

4 Claims, 19 Drawing Sheets

U.S. PATENT DOCUMENTS

| | | |
|---|---|---|
| 4,094,575 | 6/1978 | Kellie . |
| 4,111,524 | 9/1978 | Tomlinson, III . |
| 4,153,330 | 5/1979 | Tomlinson, III . |
| 4,198,117 | 4/1980 | Kobayashi . |
| 4,336,976 | 6/1982 | Rodemann et al. . |
| 4,362,359 | 12/1982 | Dammann et al. . |
| 4,420,217 | 12/1983 | Gerharz . |
| 4,420,829 | 12/1983 | Carlson . |
| 4,449,785 | 5/1984 | Huignard et al. . |
| 4,452,533 | 6/1984 | Miles et al. . |
| 4,522,462 | 6/1985 | Large et al. . |
| 4,545,646 | 10/1985 | Chern et al. ............................ 359/15 |
| 4,615,034 | 9/1986 | von Gunten et al. . |
| 4,643,519 | 2/1987 | Bussard et al. . |
| 4,669,811 | 6/1987 | McQuoid . |
| 4,671,603 | 6/1987 | McQuoid et al. . |
| 4,726,655 | 2/1988 | Mahlein . |
| 4,733,253 | 3/1988 | Daniele ................................... 372/32 |
| 4,759,596 | 7/1988 | Po et al. ................................. 359/15 |
| 4,770,496 | 9/1988 | Mahlein . |
| 4,773,063 | 9/1988 | Hunsperger et al. . |
| 4,805,185 | 2/1989 | Smith . |
| 4,810,047 | 3/1989 | Pernick . |
| 4,824,193 | 4/1989 | Maeda et al. . |
| 4,840,456 | 6/1989 | Fye . |
| 4,879,167 | 11/1989 | Chang . |
| 4,907,237 | 3/1990 | Dahmani et al. . |
| 4,919,532 | 4/1990 | Mocker et al. . |
| 4,923,270 | 5/1990 | Carter . |
| 4,926,412 | 5/1990 | Jannson et al. . |
| 4,927,220 | 5/1990 | Hesselink . |
| 4,965,152 | 10/1990 | Keys et al. . |
| 5,026,131 | 6/1991 | Jannson et al. . |
| 5,042,042 | 8/1991 | Hori et al. . |
| 5,054,028 | 10/1991 | Esherick et al. .................... 372/102 |
| 5,082,337 | 1/1992 | Chern et al. . |
| 5,107,359 | 4/1992 | Ohuchida . |
| 5,119,454 | 6/1992 | McMahon . |
| 5,230,005 | 7/1993 | Rubino et al. ....................... 372/102 |
| 5,299,212 | 3/1994 | Koch et al. ........................... 372/32 |
| 5,315,436 | 5/1994 | Lowenhar et al. .................... 359/569 |
| 5,491,570 | 2/1996 | Rakuljic et al. ...................... 359/15 |

OTHER PUBLICATIONS

Patent Abstracts of Japan, vol. 11, No. 171 (E–512) (2618) Jun. 2, 1987 & JP, A, 62,005 677 (Matsushita) 12 Jan. 1987.

"A.M. Glass, The Photorefractive Effect," *Optical Engineering*, vol. 17, No. 5, p. 470 (Sep.–Oct. 1978).

Meyer et al., "Kinetics of Fixation of Phase Holograms in $LiNbO_3$," *Phys. Stat. Sol* (a) vol. 53, p. 171 (1979).

Hertel et al, "Theory of Thermal Hologram Fixing and Application to $LiNbO_3$:Cu", *Phys. Stat. Sol.* (a) vol. 104, p. 844 (1987).

David M. Pepper et al, "The Photorefractive Effect," *Scientific American*, Oct. 1990.

Vladimirtsev et al, "Optical Damage in Transition Metal Doped Ferroelectric," *Ferroelectrics*, vol. 22, 1978, pp. 653–654.

W. Phillips et al., "Optical and Holographic Storage Properties of Transition Metal Doped Lithium Niobate," *RCA Review*, vol. 33, p. 94 (Mar. 1972).

Staebler et al., "Multiple Storage and Erasure of Fixed Holograms in Fe–Doped $LiNbO_3$," *Applied Physics Letters*, vol. 26, No. 4, p. 182 (Feb. 15, 1975).

Staebler et al., "Thermally Fixed Holograms in $LiNbO_3$," *Ferroelectrics*, vol. 3, p. 107 (1972).

Amodei et al., "Holographic Pattern Fixing in Electro–Optic Crystals," *Applied Physics Letters*, vol. 18, No. 12, p. 540, (Jun. 15, 1971).

K. Blotekjaer, "Limitations on Holographic Storage Capacity of Photochromic and Photorefractive Media," *Applied Optics*, vol. 18, No. 1, p. 57 (Jan. 1, 1979).

W.V. Smith, "Large Capacity Holographic Memory," *IBM Technical Disclosure Bulletin*, vol. 15, No. 3, Aug. 1972.

Thomas Stone and Nicholas George, "Hybrid Diffractive–Refractive Lenses and Achromats," *Applied Optics*, vol. 27, No. 14, Jul. 15, 1988.

N.V. Kukhtarev et al., "Holographic Storage in Electrooptic Crystals. I. Steady State," *Ferroelectrics*, vol. 22, pp. 949–960, 1979.

Tom Parish, "Crystal Clear Storage," *BYTE*, p. 283, Nov. 1990.

"S.W. McCahon et al., Hologram Fixing in $Bl_{12}TiO_{20}$ Using Heating and an AC Electric Field," *Applied Optics*, vol. 28, No. 11, Jun. 1, 1989.

G.D. Stucky et al., "Quantum Confinement and Host/Guest Chemistry: Probing a new Dimension," *Articles*, Feb. 9, 1990.

J.F. Scott et al., "Ferroelectric Memories," *Science*, vol. 246, p. 1400.

B.I. Greene, "All–Optical Nonlinearities in Organics," *Articles*, Feb. 1990.

Amon Yriv et al., "High Resolution Volume Holography Using Orthogonal Data Storage,": *OSA Topical Meeting on Photorefractive Materials*, Jul. 1991, pp. 130–132.

D.W. Woodbury et al., "Hologram Indexing in $LiNbO_3$ with a Tunable Pulsed Laser Source," *Applied Optics*, vol. 18, No. 15, Aug. 1, 1979, pp. 2555–2558.

W.J. Burke et al., "Volume Phase Holographic Storage in Ferroelectric Crystals," *Optical Engineering*, vol. 17, No. 4, Jul.–Aug. 1978, pp. 308–316.

C. Gu et al., "Diffraction Properties of Fixed Gratings in Photreafractive Media," *Journal of the Optical Society of America B: Optical Physics*, vol. 7, No. 12, Dec. 1990, pp. 2339–2346.

S. Wu et al, "Reconfigurable Interconnections Using Photreactive Holograms," *Applied Optics*, vol. 29, No. 8, Mar. 10, 1990, pp. 118–1125.

*Electronics Letters*, vol. 21, No. 20, Sep. 26, 1985, Enage GB, pp. 885–886, P. Mills et al., "Holographically Formed, Highly Selective, Infra–red Filter in Iron–Doped Lithium Niobate".

*RCA Review*, vol. 33, Mar. 1972, Princeton US, pp. 71–93, J. J. Amodei et al., "Holographic Recording in Lithium Niobate".

*Optics Letters*, vol. 16, No. 19, Oct. 1991, Washington US, pp. 1481–1483, Henri Rajbenbach et al., "Low–Noise Amplification of Ultraweak Optical Wave Fronts in Photorefractive Bi12Si020".

*Journal of the Optical Society of America*, vol. 7, No. 8, Aug. 1989, pp. 1436–1440, Xiaohui Ning, "Analysis of Multiplexed–Reflection Holographic Gratings".

*Electronics Letter*, vol. 21, No. 15, Jul. 18, 1985, Enage GB, pp. 648–649, P. Mills et al. "Single–Mode Operation of 1.55 μm Semiconductor Lasers Using A Volume Holographic Grating".

*Journal of Applied Physics*, vol. 47, No. 12, Dec. 1976, New York US, pp. 5421–5431, Rajiv R. Shah et al., "Characterization of Iron–Doped Lithium Niobate for Holographic Storage Applications".

*Topics in Applied Physics*, vol. 20, 1977, Berlin, H.M. Smith, pp. 10–20, "Holographic Recording Materials".

*Optics Communications*, vol. 29, No. 1, Apr. 1979, Amsterdam NL, pp. 44–47, M.P. Petrov et al., "Light Diffraction From the Volume Holograms in Electrooptic Birefringent Crystals".

WAVELENGTH STABILIZED LASER SOURCES USING FEEDBACK FROM VOLUME HOLOGRAMS

CROSS-REFERENCE TO RELATED APPLICATIONS

This is a continuation-in-part of application Ser. No. 07/991,571, entitled "Methods and Devices for using Photorefractive Materials at Infrared Wavelengths," filed Dec. 16, 1992, by G. A. Rakuljic and V. Leyva, now U.S. Pat. No. 5,491,570 which is a continuation-in-part of application Ser. No. 07/965,746, entitled "Fixing Method for Narrow Bandwidth Volume Holograms in Photorefractive Materials," filed Oct. 23, 1992, by V. Leyva and G. A. Rakuljic, now U.S. Pat. No. 5,335,098 which is a continuation-in-part of application Ser. No. 07/908,298, entitled "Photorefractive Systems and Methods," filed Jul. 2, 1992, by G. A. Rakuljic and A. Yariv, now U.S. Pat. No. 5,440,669, issued Aug. 8, 1995 which is a continuation-in-part of application Ser. No. 07/736,736, entitled "Photorefractive Systems and Methods," filed Jul. 26, 1991, by G. A. Rakuljic and A. Yariv, now abandoned all of which applications are incorporated by reference herein.

BACKGROUND OF THE INVENTION

1. Field of the Invention

This invention relates to systems and methods for controlling the output wavelength of a coherent wave source using feedback from a volume hologram wavelength standard, and more particularly, to improved methods and devices for control of laser output wavelength to very high precision. The optical output from the laser is filtered by a highly selective volume hologram reflection grating, which acts as an external wavelength standard, and is fed back to the laser in the form of an optical or electrical signal to control its output wavelength.

2. Description of Related Art

Volume hologram reflection gratings have been shown to be an extremely accurate and temperature-stable means of filtering a narrow passband of light from a broadband spectrum. This technology has been demonstrated in a practical application, where a holographic grating optical filter with a ⅛ Å full width at half maximum (FWHM) passband at the 6564.6 Å ($H_\alpha$) solar absorption wavelength was fabricated. Moreover, such filters have arbitrarily selectable wavefront curvatures, center wavelengths, and output beam directions. The temperature stability of the filter substrate, which was Iron (Fe) doped lithium niobate ($LiNbO_3$) in this application, was determined by measuring the wavelength shift of the filter as a function of temperature. This temperature-induced wavelength shift was approximately 1 Å per 30° C. at 6564.6 Å. (See, G. A. Rakuljic and V. Leyva, "Volume holographic narrow-band optical filter," Opt. Lett. vol. 18, pp. 459–461 (1993)).

Photorefractive crystals such as $LiNbO_3$ have been shown to be effective media for storing volume holographic gratings such as for optical filters or holographic optical memories with high diffraction efficiency. In conjunction with techniques for writing high diffraction efficiency reflection gratings in these materials, methods of "fixing" the gratings so they cannot be erased by subsequent illumination have been developed. (See, e.g., J. J. Amodei and D. L. Staebler, "Holographic recording in lithium niobate," RCA Review, vol. 33, pp. 71–94 (1972); V. Leyva and G. A. Rakuljic, "Fixing Method for Narrow Bandwidth Volume Holograms in Photorefractive Materials," U.S. patent application Ser. No. 07/965,746 now U.S. Pat. No. 5,335,098 (1992) supra; and G. A. Rakuljic and A. Yariv, "Photorefractive Systems and Methods," U.S. patent application Ser. No. 07/908,298 now U.S. Pat. No. 5,440,669 (1992) supra). In addition, plane gratings Bragg-matched to reflect at normal incidence in the infrared have been successfully recorded in $LiNbO_3$ using a technique of writing from the side face in a transmission mode geometry with the correct incidence angle and shorter wavelength light, where the photorefractive sensitivity of the material is much higher than in the infrared. (See, G. A. Rakuljic and V. Leyva, "Methods and Devices for using Photorefractive Materials at Infrared Wavelengths," U.S. patent application Ser. No. 07/991,571 now U.S. Pat. No. 5,491,570 (1992) supra).

Accurate wavelength lasers are needed as transmitter sources for Wavelength Division Multiplexed (WDM) fiber-optic communications, pump lasers for various media such as Erbium (Er) doped optical fiber amplifiers (EDFA) or solid state lasers, illumination sources for differential spectroscopy, and other applications requiring compact, precise wavelength sources. In telecommunications, semiconductor lasers have been used because of their small size, low cost, high efficiency, and ability to be modulated at high speed. These sources typically operate in the 1.3 µm band, which is at the zero dispersion point of conventional optical fibers, and more recently in the 1.55 µm band because of the loss minima and the availability of Er-doped EDFA's in this wavelength band.

Conventional semiconductor lasers used in optical telecommunications have the inherent problem of wavelength uncertainty due to the large spectral width of their gain media. This allows laser oscillation over a wide range of wavelengths where the optical gain exceeds the total loss in the laser cavity. Consequently, the output of a simple Fabry-Perot laser is multi-mode, so its wavelength can be specified only to within 100 to 200 Å of its target design wavelength. The more expensive distributed feedback (DFB) or distributed Bragg reflector (DBR) lasers incorporate distributed reflectors to produce a single-mode, fixed wavelength output, but this output can be specified only to about 40 Å accuracy. This is true even among lasers in the same manufacturing lot. Moreover, their operating wavelengths can drift during use due to temperature changes and aging of the laser.

In recent years, there has been tremendous interest in WDM because of the projected need for additional capacity in future lightwave communications systems. Current approaches to high capacity links rely on time division multiplexing (TDM), where extremely high speed modulation speeds are proposed (at up to 1 THz or more) to increase the information carrying capacity of a fiber. Multiple, parallel fiber links are another option, although each fiber will need its own set of repeaters, which can escalate costs tremendously in a long distance installation.

The advent of EDFA's has made WDM extremely attractive for fiber communications systems. A single EDFA can amplify a broad spectrum (approximately 400 Å wide) of light, enabling a single fiber to support multiple wavelength signals with a common amplifier. This allows a multi-fold increase in the information carrying capacity of a single fiber, especially if the wavelength channels can be spaced close together within the amplification bandwidth of the EDFA. However, past attempts at WDM have been limited by the lack of sufficient wavelength accuracy of semiconductor lasers to take full advantage of WDM technology.

This uncertainty in semiconductor output wavelengths has limited the channel carrying capacity of multi-wavelength telecommunications systems. Even with sufficiently narrow bandwidth filters and couplers, channel carrying capacity in WDM communications systems is still limited by the absolute accuracy of the laser sources. This lack of wavelength accurate semiconductor lasers has hindered the widespread development and deployment of WDM telecommunications systems.

SUMMARY OF THE INVENTION

To overcome the limitations in the prior art described above, and to overcome other limitations that will become apparent upon reading and understanding the present specification, a laser utilizes feedback from a volume holographic grating used as a wavelength standard to lock the laser output wavelength to its desired value. This feedback can be non-optical, wherein the holographic filter output is used to actively control the wavelength through an external control mechanism, or optical, wherein a volume hologram reflection grating is used to generate optical feedback into the laser gain.

In the first embodiment, part of the output power of the laser is filtered using a volume hologram reflection grating and directed onto a detector. The volume hologram, used as a wavelength standard, is kept at a constant temperature for wavelength accuracy. The signal from the detector is then passed to a control system which uses this information to adjust the wavelength of the laser until the desired output wavelength is obtained. Variations of this system can be used with any externally tunable laser, such as a dye, tunable solid state, or semiconductor laser. For example, a DFB semiconductor laser is tuned by varying its temperature via a thermoelectric Peltier cooler, a DBR laser is tuned by adjusting the current through the Bragg reflector section to change its index of refraction, and dye, solid state, and grating-tuned external cavity semiconductor lasers are tuned by electrically or electro-mechanically controlled birefringent filters, etalons, or gratings.

In a more specific example, as applied to an improved wavelength stabilized communications laser, a DFB laser is mounted on a temperature-controlled heat sink so that temperature control can be used as a wavelength tuning mechanism. Part of the output is coupled to a volume hologram Bragg matched to reflect at the desired operating wavelength of the laser to filter the signal to the detector. At the signal maximum, the laser will be operating at the desired wavelength. The wavelength of the laser is dithered by the control system to determine the local slope of the filter response, and adjusted until the detector reads the maximum signal, indicating that the laser is on band. As the laser output drifts off band, the control system adjusts the output back to the center wavelength of the filter.

A variation of the above system uses two holographic gratings, either discrete or coextensively written in the same crystal, with center wavelengths shifted slightly above and below the desired wavelength, so the operating point of the laser is between the peaks of the two filters. The center wavelengths of the two filters are selected so that opposite slopes of their spectral response curves intersect at the desired operating wavelength, thereby comprising crossed or crossover holographic filters. The output signals from the two detectors are subtracted by a difference amplifier and normalized by the total output so that the direction as well as the magnitude of the deviation can be determined. This eliminates the need to dither the wavelength to determine the local slope of the wavelength deviation. The normalized difference signal is used by the processor and controller to determine the magnitude and direction of deviation of the laser output wavelength from the desired value and adjusts the temperature of the laser accordingly. The temperature controller continuously makes fine adjustments to the operating temperature to maintain the output of the laser at the set wavelength.

Another aspect of this invention is that the operating point at which stabilization is sensed, such as the intersection point between two the two spectral response curves, need not correspond to the wavelength of operation of the source that is being stabilized. An offset factor can be introduced to compensate for spectral response curves that are unlike, or are not precisely placed relative to the wavelength to be generated. This feature can also be used to detune the operating wavelength of the source for differential measurements or calibration purposes.

An accurate wavelength laser device with the additional feature of wavelength tunability (in discrete increments of approximately 1 Å or greater) can be configured using either of the approaches described above. Multiple gratings (or grating pairs in the crossed filter example) corresponding to the desired wavelengths are recorded in the photorefractive crystal with the spacing between them much greater than the bandwidth of the individual gratings. The laser is tuned (by temperature or other means) to a wavelength in the vicinity of one of the filters or filter pairs using the same processor and controller architecture as in the previous examples. The laser wavelength control mechanism thereafter locks the output wavelength to the setpoint using the feedback signal from the holographic filter(s).

Further, in accordance with the invention, these wavelength stabilization systems can be used with any coherent optical or infrared energy source wherein the wavelength is controllable, at least to a degree, by adjustment of some parameter. For telecommunications applications, the most promising sources are temperature-tuned DFB and electrically-tunable DBR lasers.

The second embodiment of this invention uses optical feedback to lock the laser output wavelength to that of the holographic grating. This is done by using a holographic grating reflector, characterized by its narrow reflection bandwidth, as one of the cavity mirrors in a laser resonator, thereby using optical feedback as the wavelength control mechanism. The narrow bandwidth holographic grating reflector forces the laser to oscillate only at a specific wavelength, which is that of the volume grating. This technique, in principle, can be used with any laser gain medium where the reflection off the holographic grating generates enough feedback in the optical resonator to enable laser oscillation.

A specific example of this invention is an external cavity semiconductor laser using a volume holographic reflection grating as the external reflector. One facet of an (inexpensive) Fabry-Perot semiconductor laser is anti-reflection (AR) coated, while the other facet is coated for high reflection. A holographic grating, which is Bragg-matched for normal incidence reflection at the exact desired operating wavelength of the laser, is positioned to reflect the radiation emitted from the AR-coated side back into the laser. With proper alignment, laser oscillation occurs only in the external cavity bounded by the holographic grating and the high reflection facet of the semiconductor laser. The grating reflects only a narrow wavelength spectrum (within 0.5 Å or so, depending on the grating thickness), therefore locking the laser output to a fixed wavelength with very high accuracy.

The volume holographic gratings are prepared by writing a plane wave reflection hologram in the storage medium, which in this embodiment is a photorefractive $LiNbO_3$ crystal, so it is Bragg-matched to retro-reflect light at the desired operating wavelength of the laser at normal incidence. The grating is written directly with the same wavelength as that of intended operation in the counter-propagating geometry for wavelengths within the photorefractive sensitivity range of the crystal. Alternatively, for longer wavelengths, the grating is written indirectly by using off-axis beams from the side faces at a shorter wavelength, where the crystal has higher photosensitivity, to obtain the proper grating spacing, as described in G. A. Rakuljic and V. Leyva, U.S. patent application Ser. No. 07/965,746, (1992) supra. The gratings are fixed so they will not be erased by illumination during operation.

The ability to achieve precise control of laser output wavelength has ramifications in a number of system applications. The sources in a WDM system, for example, can have much smaller band separations than heretofore possible, permitting more efficient use of the available transmission spectrum within an optical fiber or optical fiber amplifier. Two wavelength stabilized signals at different frequencies can be heterodyned to produce a difference output in the optical or microwave band. Pump energy for a laser can be provided in that part of its absorption spectrum at which most efficient amplification takes place. These and other benefits derive from the fact that the holographic filter serves as a stable secondary reference that serves as a wavelength standard in device and system operation and is readily stabilized because of its insensitivity to temperature and voltage variations.

BRIEF DESCRIPTION OF THE DRAWINGS

For a better understanding of the present invention, reference is made to the following detailed description and the attached figures, where.

DETAILED DESCRIPTION OF THE INVENTION

In the following description of the present invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
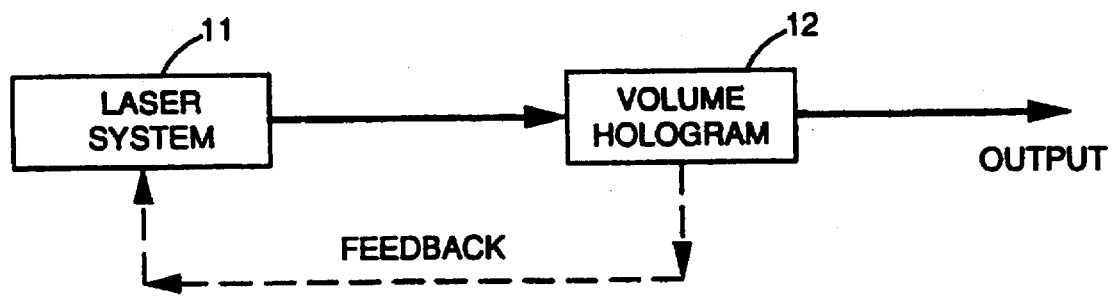
FIG. 1 is a schematic diagram of the general concept of using volume holographic gratings to generate feedback (such as electrical or optical signals) to control the output wavelength of a laser to high precision.

In FIG. 1, the general concept is illustrated of the method of controlling the output wavelength of a laser system 11 using a volume holographic grating 12 in a photorefractive crystal or other suitable medium as an external reference element. Feedback from a volume hologram reflection grating, which serves as a wavelength standard external to the laser itself, is used to control its output wavelength. This feedback can be electrical, with active control of the laser wavelength, or optical, where the light reflected off the holographic grating is used in a passive process.

In the active feedback approach, light reflected off the holographic grating is passed to a detector, producing a signal which is a function of the laser output wavelength. The resulting signal is interpreted by the controller and used to tune the laser by some mechanism, such as by activating a thermoelectric cooler, changing the current through some device which controls the wavelength, or using a mechanical or electro-mechanical motion control apparatus to physically move the wavelength selective element. In the other approach to this method of using feedback from volume holograms, the feedback is implemented in optical form, where the reflection off a narrow bandwidth volume holographic grating is fed back directly into the laser as part of the laser cavity so the laser oscillates only at the fixed wavelength corresponding to that of the volume hologram.

HOLOGRAPHIC FILTER-LOCKED LASER WITH ACTIVE FEEDBACK CONTROL

Figure 2:
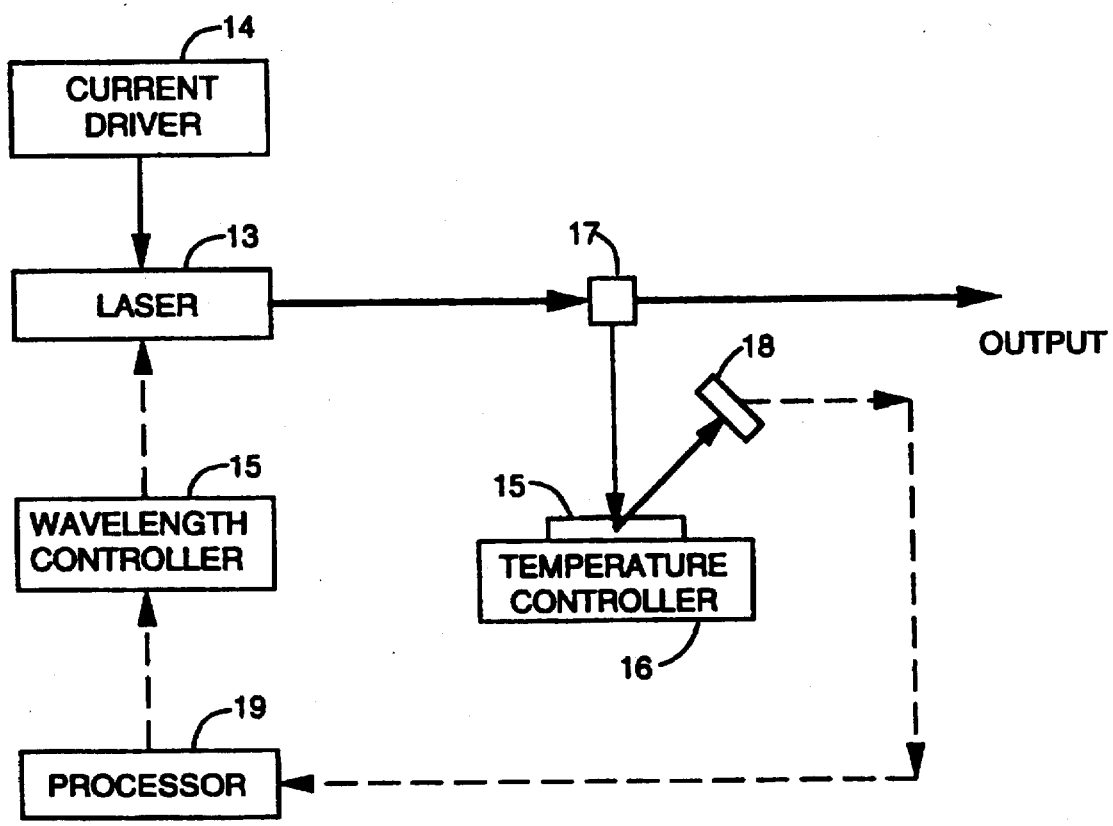
FIG. 2 illustrates a method for controlling the output wavelength of a laser using an electrical signal feedback from the reflection of a single holographic filter onto a detector to determine the actual output wavelength with reference to a fixed standard, and electrical, electro-mechanical, or thermal means to adjust the wavelength of the laser.

In FIG. 2, a schematic diagram is shown of a method for controlling the output wavelength of a semiconductor or other laser to very high precision. A laser 13 with some form of a wavelength control mechanism, such as a high quality distributed feedback (DFB) or distributed Bragg reflector (DBR) laser in optical telecommunications, is used as the source. Both lasers use distributed reflectors in the laser substrate itself to obtain single mode operation despite the large spectral width of the gain medium. A DFB laser is tuned by mounting the laser on a thermoelectric cooler and controlling its temperature; a DBR laser is tuned by varying the current through its Bragg reflector section and therefore changing its index of refraction and Bragg wavelength.

Although semiconductor lasers are used as the example in many of the following embodiments, other laser types can be used in the methods and apparatus set forth in this invention. In the case of semiconductor lasers, the optical output can be modulated with a high speed RF or digital signal through an optional current driver 14. The crystal containing the gratings 15 is also mounted on a temperature controller 16 to maintain its operating wavelength to a fixed value and also to allow calibration or detuning to a certain degree by adjusting its temperature.

The output of the laser 13 is directed to a coupler or beamsplitter 17, where a small fraction of the output wave energy is sampled and the rest transmitted as the output signal and directed into a fiber optic communications link or other utilization device. The sampled fraction is directed to a photorefractive crystal 15 containing a narrow linewidth volume hologram reflection grating, which is configured to reflect this optical signal onto the detector 18. The diffraction peak of the holographic filter is centered at the desired output wavelength of the laser. The processor 19 interprets the data from the detector 17 and adjusts the laser operating wavelength through the wavelength controller 20 by controlling its temperature or other relevant parameter.

In the normal incidence reflection (counter-propagating object and reference beam) geometry, the grating period of a holographic grating is given by $$\Delta_g = \frac{\lambda_0}{2n_0} \quad (1)$$

and the full width at half maximum (FWHM) bandwidth of a volume holographic grating used as a normal incidence reflection filter is given by $$\Delta\lambda = \frac{\lambda_0^2}{2n_0 l} \quad (2)$$

where $\lambda_0$ is the wavelength, $n_0$ is the index of refraction of the medium containing the grating, and $l$ is the grating thickness. As a numerical example, a 1 cm thick grating in LiNbO$_3$ ($n_0$=2.2) for the 1.55 μm semiconductor laser wavelength will have a bandwidth of approximately 0.5 Å. Because of the narrow bandwidth of volume hologram gratings in photorefractive materials, the filter can sense small shifts off the peak wavelength. In addition, the wavelength satisfying the Bragg condition of the grating can be changed by small changes in the physical dimensions of the crystal, such as by temperature or applying an electric field to utilize the piezoelectric effect.

In the present example, the holographic gratings are written in a photorefractive material such as LiNbO$_3$ that also has the capability of having the gratings "fixed" (or sometimes described as "fixed" and "developed") to render them permanent. If the operating wavelength of the filter is within the photorefractive sensitivity range of the material used (i.e., 350 to 700 nm for LiNbO$_3$), the gratings are written directly with the wavelengths and beam orientations desired. For the infrared region, which comprise the bulk of semiconductor lasers, plane reflection gratings are written by using visible light illuminating the crystal from the side in a transmission mode configuration so the gratings are Bragg-matched to infrared light in the reflection mode geometry, as described in the parent applications, supra.

Figure 3:
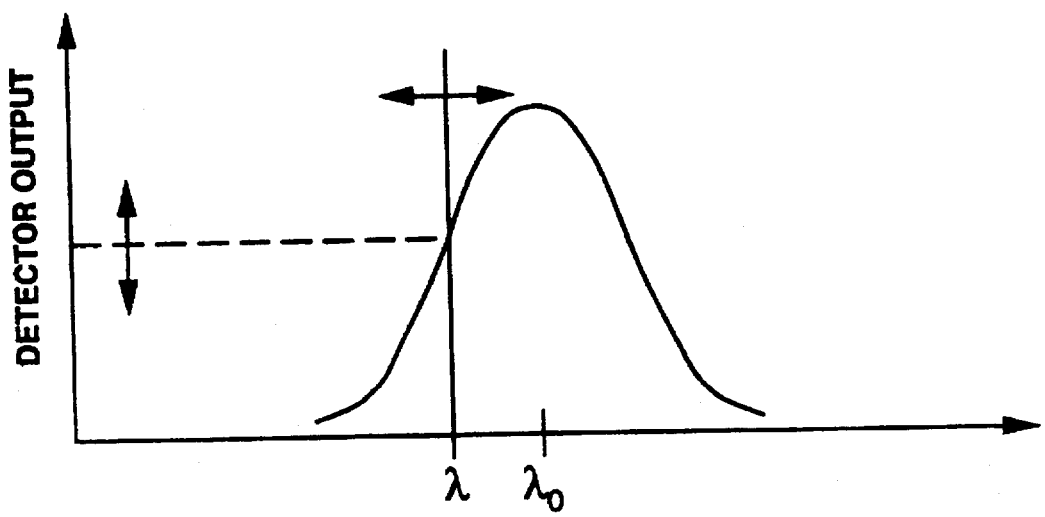
FIG. 3 is a graph of the spectral response of the signal from the detector in the architecture of FIG. 2, where the filter response is centered on $\lambda_0$ and the actual operating wavelength of the laser is shown as $\lambda$.

The detector output following reflection off the holographic filter as a function of wavelength is shown in FIG. 3. Because of the degeneracy in wavelength for a given detector output, the controller must first determine the correct side of the filter response curve for the current operating wavelength. This is done by dithering the wavelength a small amount in either direction to determine the local slope of the response curve. The controller then shifts the wavelength until the detector output reaches a maximum, or the point where the local slope of the response curve is zero. As the laser operating wavelength shifts, the control system senses this deviation and adjusts the wavelength back to the peak of the filter.

Figure 4:
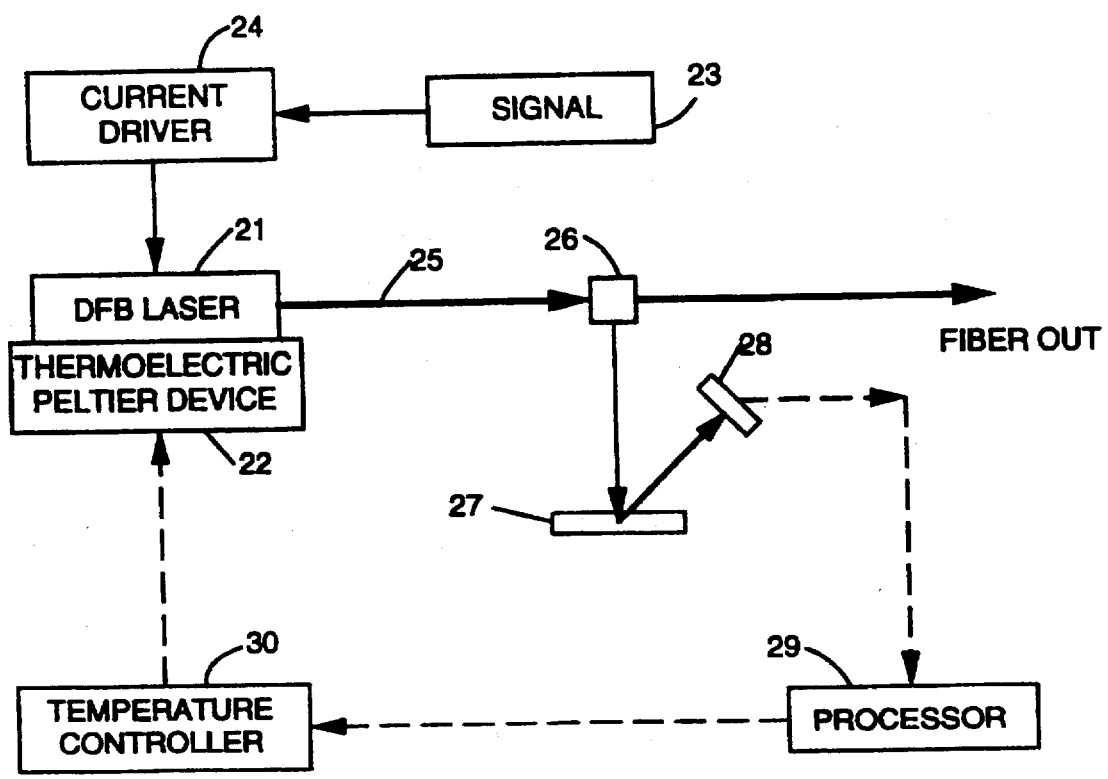
FIG. 4 is a schematic diagram of a wavelength stabilized laser system suitable for use in optical telecommunications, where in this example a DFB laser tuned by temperature control through a thermoelectric device is stabilized with electrical feedback from a volume holographic grating.

A practical example of this embodiment for telecommunications applications is illustrated in FIG. 4. A high quality single mode DFB laser 21, of the type typically used as transmitters for fiber-optic telecommunications systems, is mounted on a heat sink with a thermoelectric Peltier device 22 for temperature control of its output wavelength. Alternatively, a DBR laser, where current is used to control the refractive index of the Bragg reflector section, may be used. Both of these laser types are commonly used in telecommunications, which is one of the main applications of this technology. Note that more generally, any laser with a mechanism for controlling the wavelength, such as a tunable external cavity semiconductor, dye, or solid state laser can be used with this wavelength stabilization method.

In the example in FIG. 4, the laser 21 is modulated by a high speed analog RF or digital signal 23 through a current driver 24, and its output is directed into an optical fiber pigtail 25. A fiber coupler 26 splits off a small percentage of the output power and directs it onto a volume hologram 27, which filters a narrow spectrum of light with a response curve centered at wavelength $\lambda_0$, as shown in FIG. 3. The reflection from the filter 27 is directed to a detector 28, whose signal is interpreted by the processor 29 and used to control the wavelength of the laser 21 through the temperature controller 30 in the manner described above. The remaining output of the laser 21 is directed from the fiber coupler 26 to the output fiber link or other utilization device.

Figure 5:
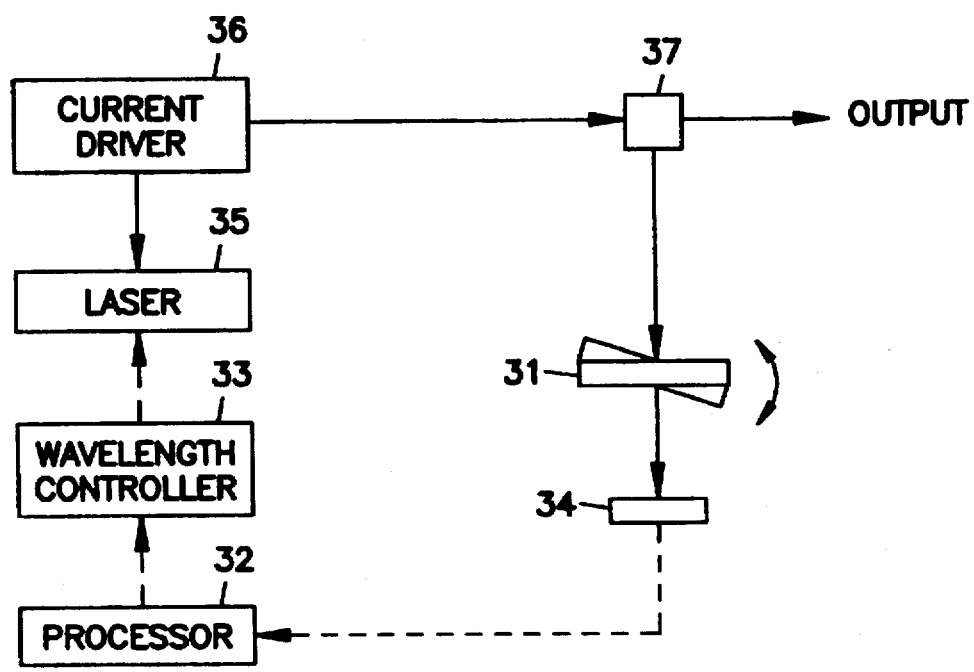
FIG. 5 is a diagram of the embodiment illustrated in FIG. 2, except that the holographic filter is used in the blocking mode and the processor is designed to detect the signal minimum to lock the laser output wavelength.

FIG. 5 illustrates an alternative approach to the method shown in FIGS. 2 and 4, where the holographic filter 31 is used in an inverse fashion, i.e., as a blocking filter. In this case, the control algorithm in the processor 32 is designed so the wavelength controller 33 searches for the signal minimum from the detector 34. Again, as in the earlier examples, some form of dithering system, where the wavelength is initially varied a small amount in either direction, is necessary to determine the local slope of the filter 31 response. Once this slope is determined, the controller 33 tunes the laser 35 until the detector 34 reads a signal minimum. A current driver 36 is used to modulate the laser 35 output, and the fiber coupler 37 directs part of the laser's output power to the holographic filter 31.

Figure 6:
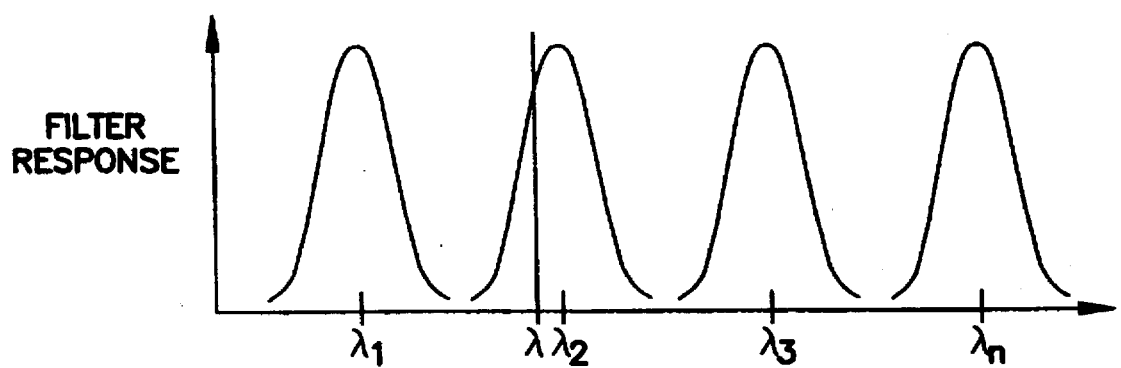
FIG. 6 is a graph of the spectral responses of multiple holographic filters used in the embodiment illustrated in FIGS. 2 or 4 or 5, showing how a laser with a selectable wavelength capability can be implemented using this method.

For discrete multi-wavelength operation, multiple filters multiplexed in a single crystal and directing their reflections to the single detector can be used. The peaks of each filter (as shown in FIG. 6) correspond to the desired operating wavelengths are sufficiently separated in wavelength (e.g. >5 Å at 1.55 µm and 0.5 Å FWHM bandwidth) so their crosstalk is negligible (e.g. <20 dB). The laser is tuned manually to the vicinity of the peak corresponding to the desired operating wavelength, so the control system fine-tunes the laser to the exact value. To switch wavelengths, the laser is manually tuned to the vicinity of the next grating, so the wavelength stabilization system can adjust the operating wavelength to the peak of the new grating. Although the FIG. 6 illustration corresponds to the reflection filter architecture of FIGS. 2 and 4, the general concept can also be applied to the approach in FIG. 5, where multiple blocking filters instead of reflective filters are used, and the control algorithm searches for a signal minimum instead of the peak.

Alternatively, a variation of the architecture illustrated in FIG. 5 uses a single holographic grating 31 that is tuned to different center wavelengths by tilting it with respect to the incident beam to tune the operating wavelength of the laser 35. For a plane grating written for a wavelength $\lambda_0$ at normal incidence, the Bragg condition as a function of deviation from the normal $\phi$ is given by $$\lambda = \lambda_0 \sqrt{1 - \frac{\sin^2\phi}{n_0^2}} \quad (3)$$

wherein $n_0$ is the index of refraction. As the grating 31 is tilted away from normal incidence, the center wavelength shifts to the blue, i.e., to shorter wavelengths. For a tuning range of 0 to 10% from the initial (normal incidence) wavelength, the angular range is 0° to 70°. After the grating 31 is set to the desired wavelength, the laser wavelength controller 33 locks onto the new operating wavelength by searching for the minimum transmitted intensity.

Figure 7:
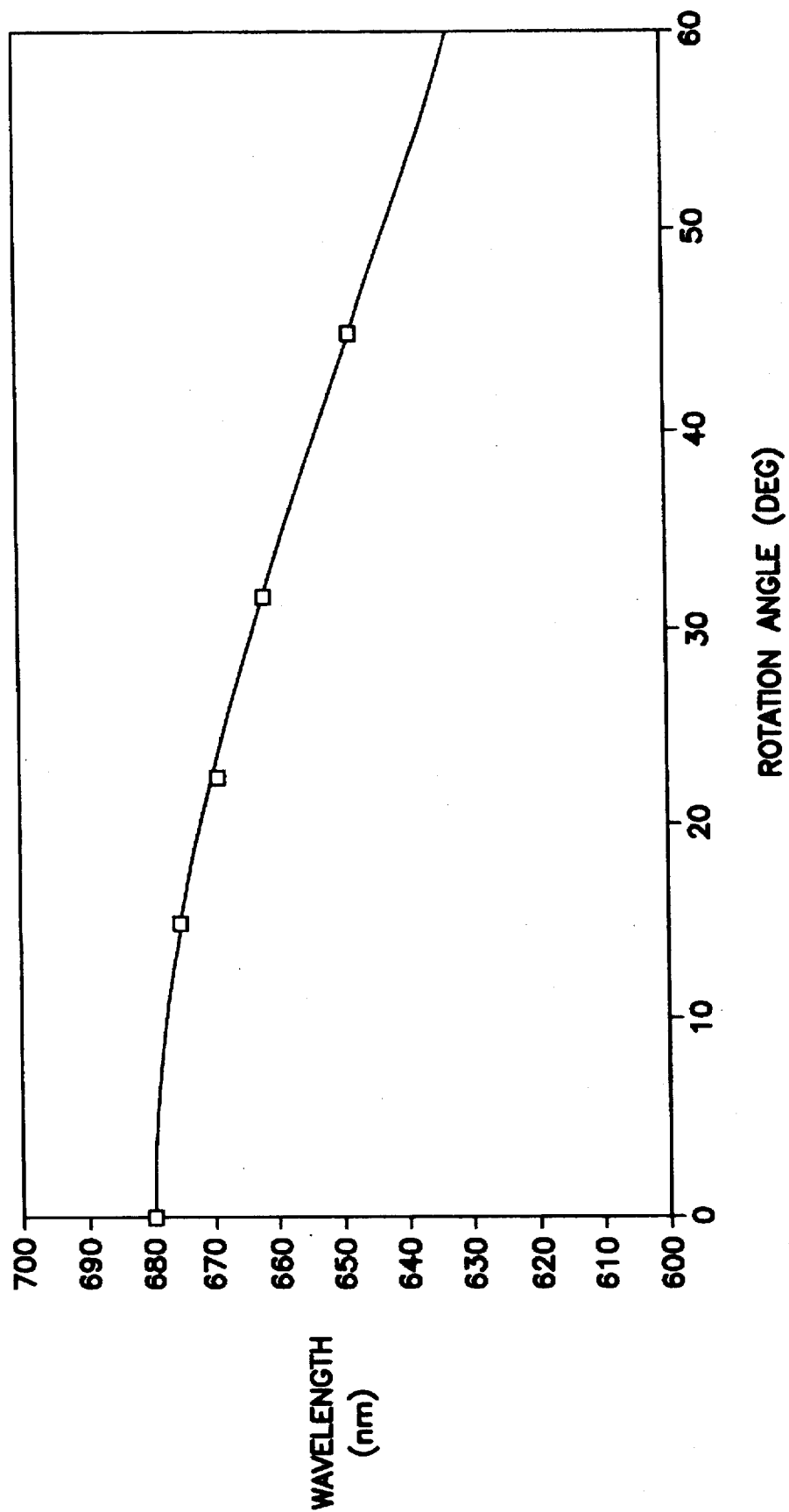
FIG. 7 is a plot of a tuning curve for a rotating plane wave grating written with counter-propagating beams at 6795 Å in $LiNbO_3$ (with $n_0=2.3$) compared to several calibration points obtained from experimental measurements.

FIG. 7 shows a plot of the center wavelength vs. rotation angle for a 6795 Å grating at normal incidence. The plot was obtained using Eqn. (3) above, and verified experimentally by the Assignee of the present application using a 2 mm thick LiNbO$_3$ crystal.

CROSSED-FILTER LASER

Figure 8A:
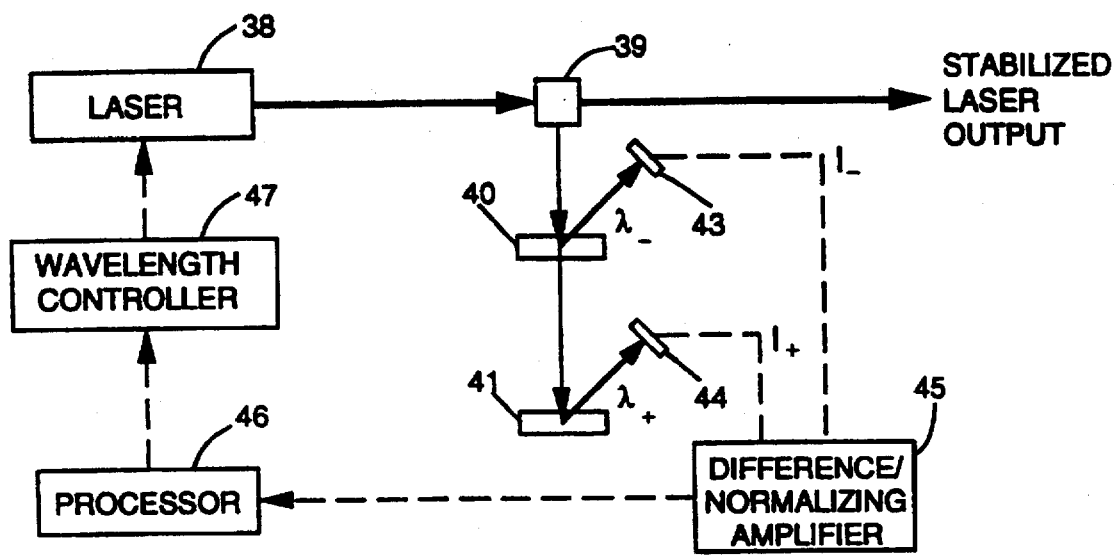
FIGS. 8a and 8b illustrate the crossed-filter method of wavelength stabilization using both (8a) discrete holographic gratings and (8b) two gratings multiplexed in a single crystal.
Figure 8B:
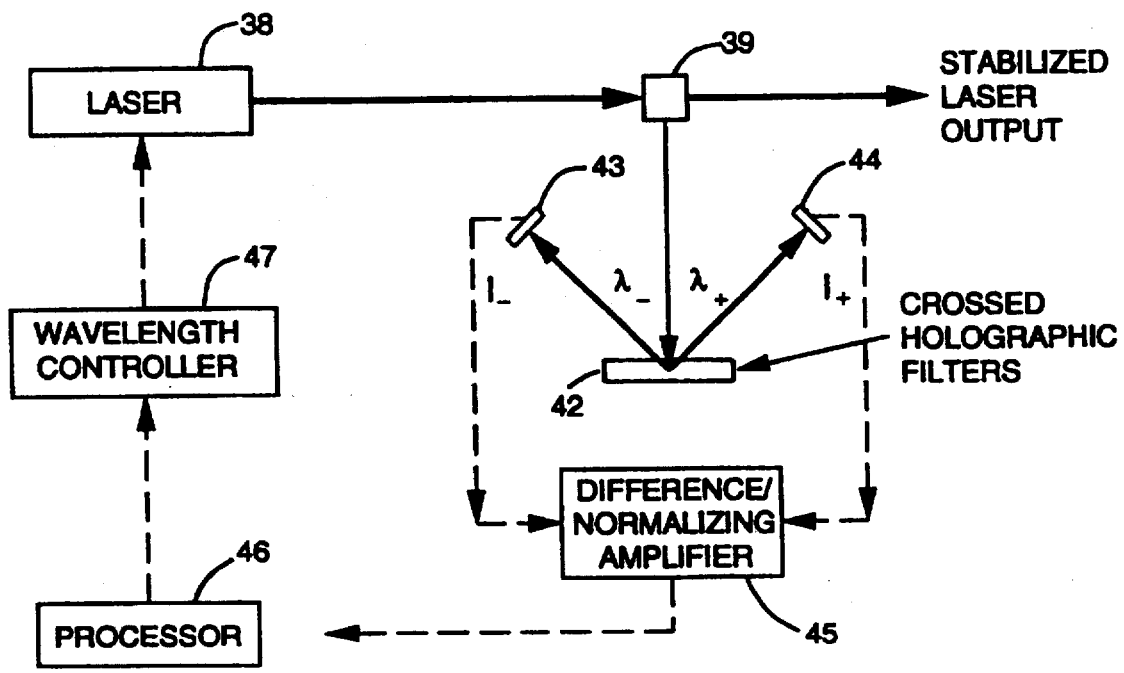
Figure 9A:
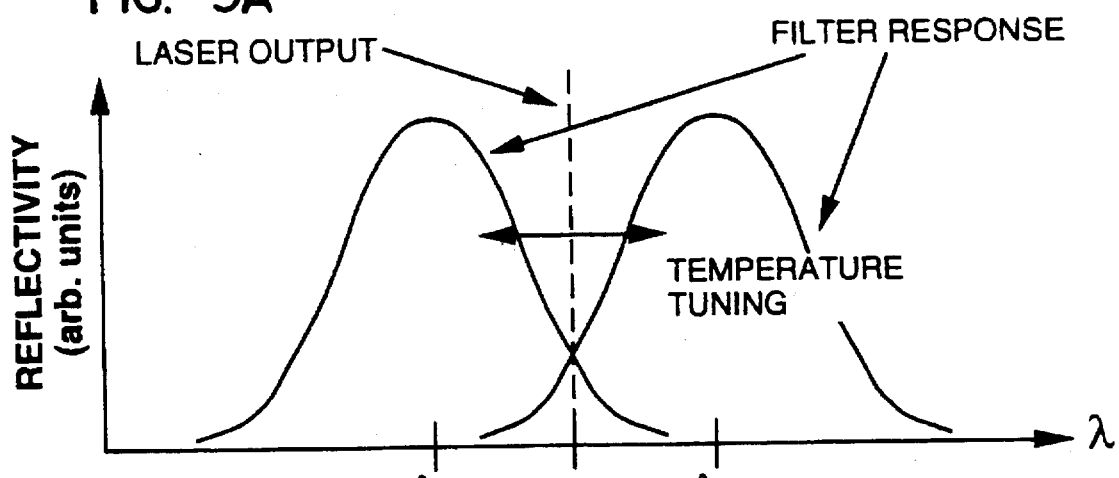
FIGS. 9a, 9b, and 9c are spectrum graphs depicting the response of the crossed filters, and also illustrating how a signal offset can be introduced to allow tuning off the intersection point of the crossed filters.

A variation of the electrical signal feedback theme is used in the crossed-filter laser, shown in schematic form in FIGS. 8a and 8b. This is similar to the configuration shown in FIGS. 2 and 4, except that two volume hologram reflection gratings are used in a crossed filter configuration. The center wavelengths of these gratings, at $\lambda_+$ and $\lambda_-$ respectively, are above and below that of the desired laser output $\lambda_0$, as shown in FIG. 9a. The spectral response curves are substantially alike in this example, in peak amplitude and bandwidth, but spaced apart. In the following discussion, the (+) subscript denotes the longer wavelength, or red-shifted, filter, while the (−) subscript denotes the shorter wavelength, or blue-shifted, filter.

The wavelengths of the two filters $\lambda_+$ and $\lambda_-$ are selected so the desired operating wavelength of the laser is at the intersection of opposing monotonically varying slopes of the spectral response curves of the two filters (see FIG. 9a). This then forms what may be called a "crossed-filter" or "cross-over filter" arrangement. Because the volume holograms have a narrow bandwidth and the crossover point is along the steepest descent region of the difference curve (see FIG. 9b), the crossed-filter response curve is extremely sharp, i.e. small changes in wavelength correspond to large changes in detector output.

In this crossed filter approach, part of the laser 38 output, which is picked off by the fiber coupler 39, is sampled by two holographic gratings, as shown in FIGS. 8a and 8b. In the system illustrated in FIG. 8a, a pair of discrete single wavelength holographic filters 40 and 41 are used; as an alternative, two filters can be written coextensively in a single crystal 42 to reflect their signals at different angles to their respective detectors 43 and 44 as shown in FIG. 8b. This pair of holographic reflection gratings with wavelengths on either side of the desired operating wavelength, whether in discrete crystals or coextensive in a single medium, comprises the crossed filters.

The crossed filters 40 and 41 reflect their corresponding wavelength signals to their respective detectors 43 and 44 respectively. The output signals from the detectors 43 and 44 are sent to a difference/normalizing amplifier 45. The signals can be directly processed using an analog difference amplifier, or this can be done digitally using analog to digital converters and a digital subtraction system. A gain control is included in the amplifier 45 to enable the output signals from the detectors 43 and 44 to be adjusted so their peak amplitudes are equal. The difference/normalizing amplifier 45 calculates the difference between the intensities, I+ and I−, measured by the two detectors 43 and 44 normalized to the total intensity $I_0$, according to the following:

$$\Delta I = \frac{I_+ - I_-}{I_0} = \frac{I_+ - I_-}{I_+ + I_-} \quad (4)$$

The normalized difference signal $\Delta I$ is then sent through a processor 46 to a wavelength controller 47 which adds a voltage shift capability to the difference output for fine-tuning the operating wavelength. The wavelength controller 47 tunes the output wavelength of the laser 38 by adjusting its control parameter. Alternatively, an analog system using summing and difference operational amplifiers can be used in place of a digital processor 46 to obtain the same ΔI result to send to the wavelength controller 47.

When the laser 38 is operating at its specified wavelength, the signals from the detectors 43 and 44 are equal, so there is zero voltage output from the difference amplifier 45 and the laser 38 is held at a constant temperature. If the laser 38 wavelength shifts towards the red with respect to the wavelength setpoint $\lambda_0$, then $I_+$ increases while $I_-$ decreases. The normalized difference signal ΔI of the two detectors 43 and 44 is obtained from the difference amplifier 45 and sent to the processor 46, which directs the wavelength controller 47 to blue-shift the laser 38 output until the difference signal returns to zero. Conversely, if the laser 38 wavelength shifts to the blue, then $I_+$ decreases while $I_-$ increases, and the controller 47 shifts the wavelength of the laser 38 in the reverse direction until its output wavelength is back to its setpoint and the difference signal is zero.

Figure 9B:
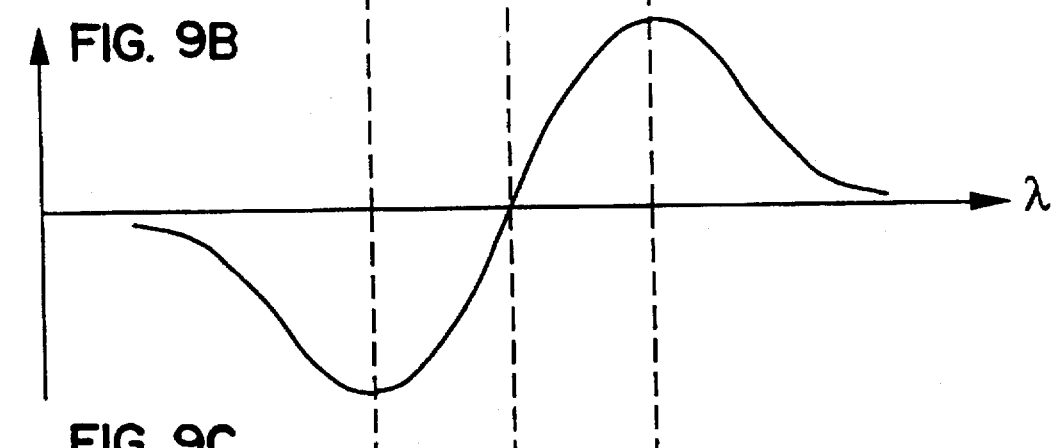

This process is illustrated graphically in FIGS. 9a and 9b, where the equilibrium point is at $\lambda_0$, where ΔI=0. In this way, the holographic filter serves as an external wavelength reference that is used to set the operating wavelength of the laser to very high precision, i.e. within a fraction of an Angstrom. Holographic filters, with their narrow bandwidth, are preferred for this invention because of their precisely placed and configured spectral response characteristics. Conventional optical bandpass filters with similar response curves and characteristics are inherently less precise and more costly and can be considered only for applications where less stringent wavelength accuracy is acceptable.

Figure 9C:
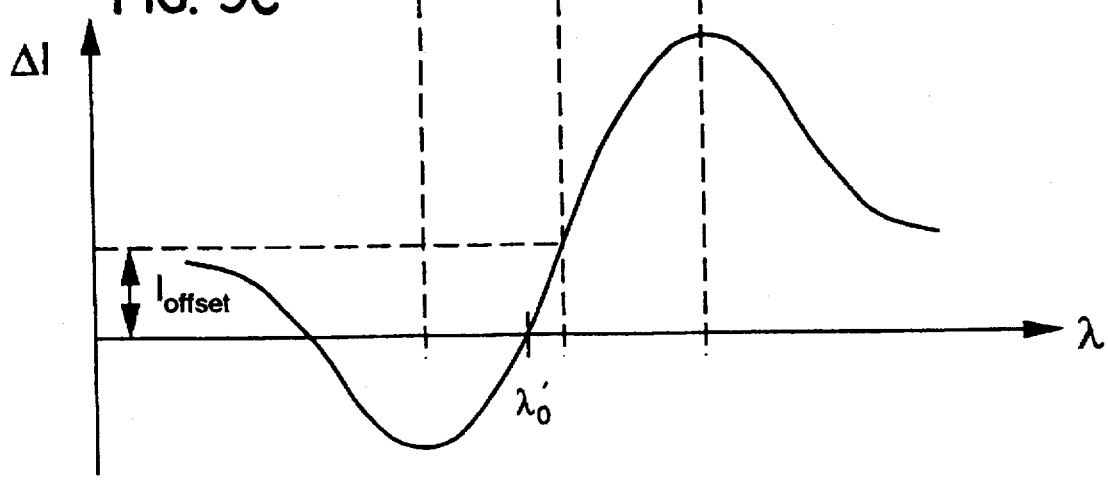

By incorporating a voltage offset mechanism or algorithm in the processor 46, the laser 38 can be locked to wavelengths other than that corresponding to the intersection of the two filter response curves. This process is shown in FIG. 9c, where it gives the system the capability for correcting small errors in wavelength during fabrication of the crossed filters by incorporating the offset in the control electronics or software, somewhat relaxing the tolerance requirements in fabricating the holographic gratings for the filters. This also allows the laser 38 to be detuned slightly for calibration purposes or applications such as differential spectroscopy requiring operation at slightly shifted wavelengths.

Figure 10:
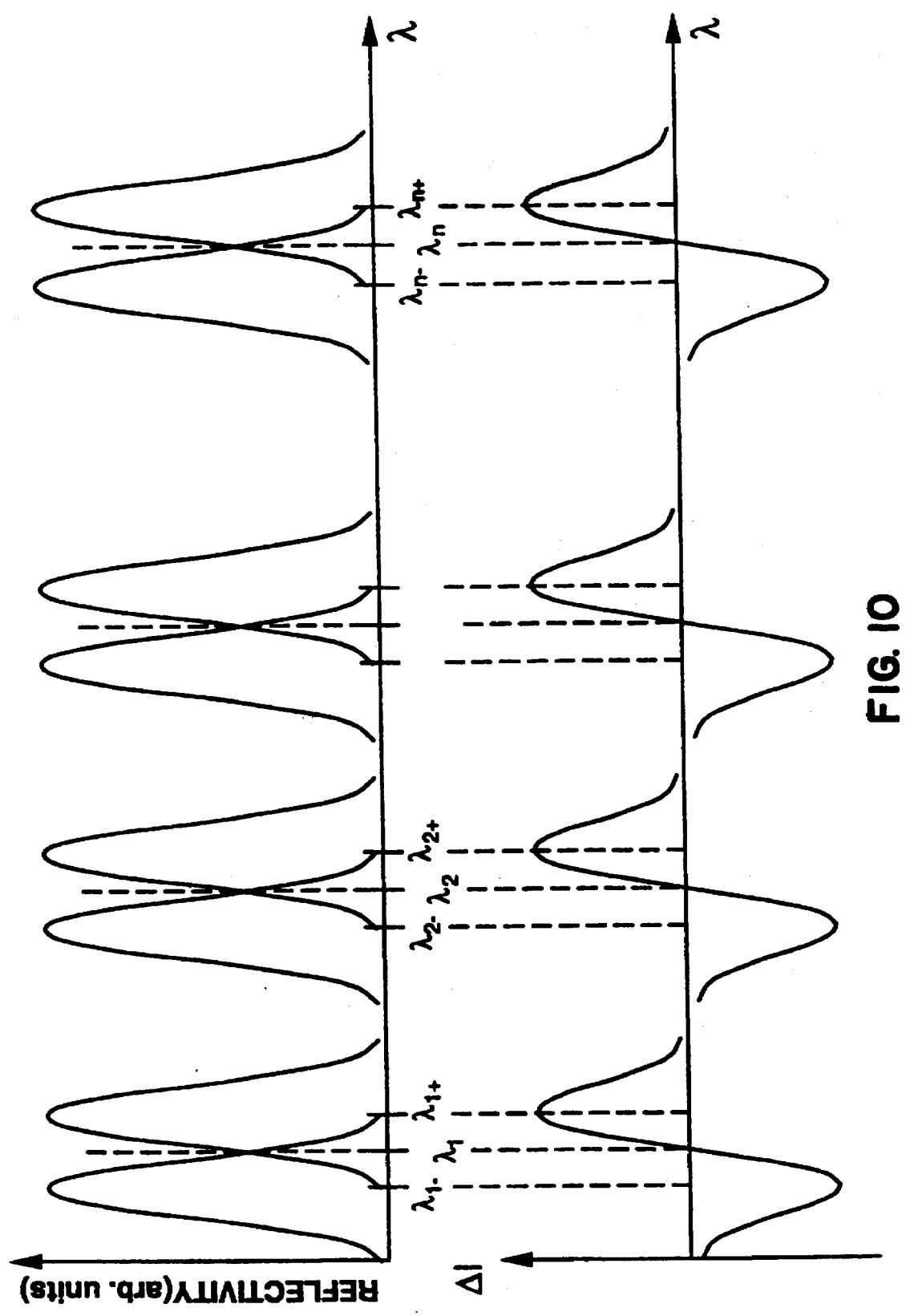
FIG. 10 is a graph of the spectral response from multiple crossed holographic filters for use with a laser similar to the one illustrated in FIG. 2, but that can be operated at any one of a number of wavelengths.

FIG. 10 is a graph of the spectral response and current difference from the two detectors of a multi-wavelength crossed-filter DFB laser with n wavelength multiplexed filter pairs. The multiple wavelength, crossed-filter DFB laser system with discrete tunability is constructed by recording multiple grating pairs in the photorefractive crystal, with each set of gratings reflecting their signals to the same pair of detectors. The crossed-filter grating at wavelengths $\lambda_1, \lambda_2, \ldots, \lambda_n$, are sufficiently separated in wavelength so that their crosstalk is negligible, e.g., approximately 1 Å or greater in a 1 cm thick filter for infrared wavelengths. Preferably, the separation is an order of magnitude greater than the FWHM bandwidth of one of the gratings, which is 0.5 Å for a 1 cm thick filter at 1.55 μm. The laser is first tuned (either by temperature control or other means) to near a desired wavelength $\lambda_i$, within the range ($\lambda_{i-}, \lambda_{i+}$). A control circuit, such as described above, is used to fine-tune the output wavelength to exactly $\lambda_i$.

To switch operating wavelengths, the laser is tuned manually or by a program control to a wavelength between the peaks of the new filter pair, and the control circuit automatically makes fine adjustments until the laser settles at the exact wavelength corresponding to the crossed-filter pair. Once the wavelength is set within the notch of the cross filter responses, the laser stabilizes at the intersection wavelength or at the pre-programmed offset value if this option is used.

Many lasers, especially low cost semiconductor lasers, have wide fabrication tolerances for their output wavelengths, and many are subject to drift with time and changes in operating conditions. The holographic grating, used in the manner of the present invention, provides a secondary wavelength standard that is essentially invariant. Applied voltages have little effects on wavelength stabilization, but if the effect is significant, the voltage can readily be set at a controlled level. Temperature has a known effect with most lasers, but is so small (e.g., 1 Å per 30° C.) that thermoelectric or other temperature stabilization is no problem in the current state of the art. The control of temperature within the range of 5° C. retains the wavelength within a small fraction of an Angstrom relative to the selected wavelength. Typically, devices in accordance with the invention are operated well within a 2 Å wide range relative to a predetermined center wavelength. However, by writing the holographic gratings with a wavelength stabilized system, and employing a photorefractive crystal of adequate thickness and therefore volumetric capacity, the target wavelength can be maintained within of the order of 0.25 Å, dependent upon the wavelength under consideration.

Figure 11:
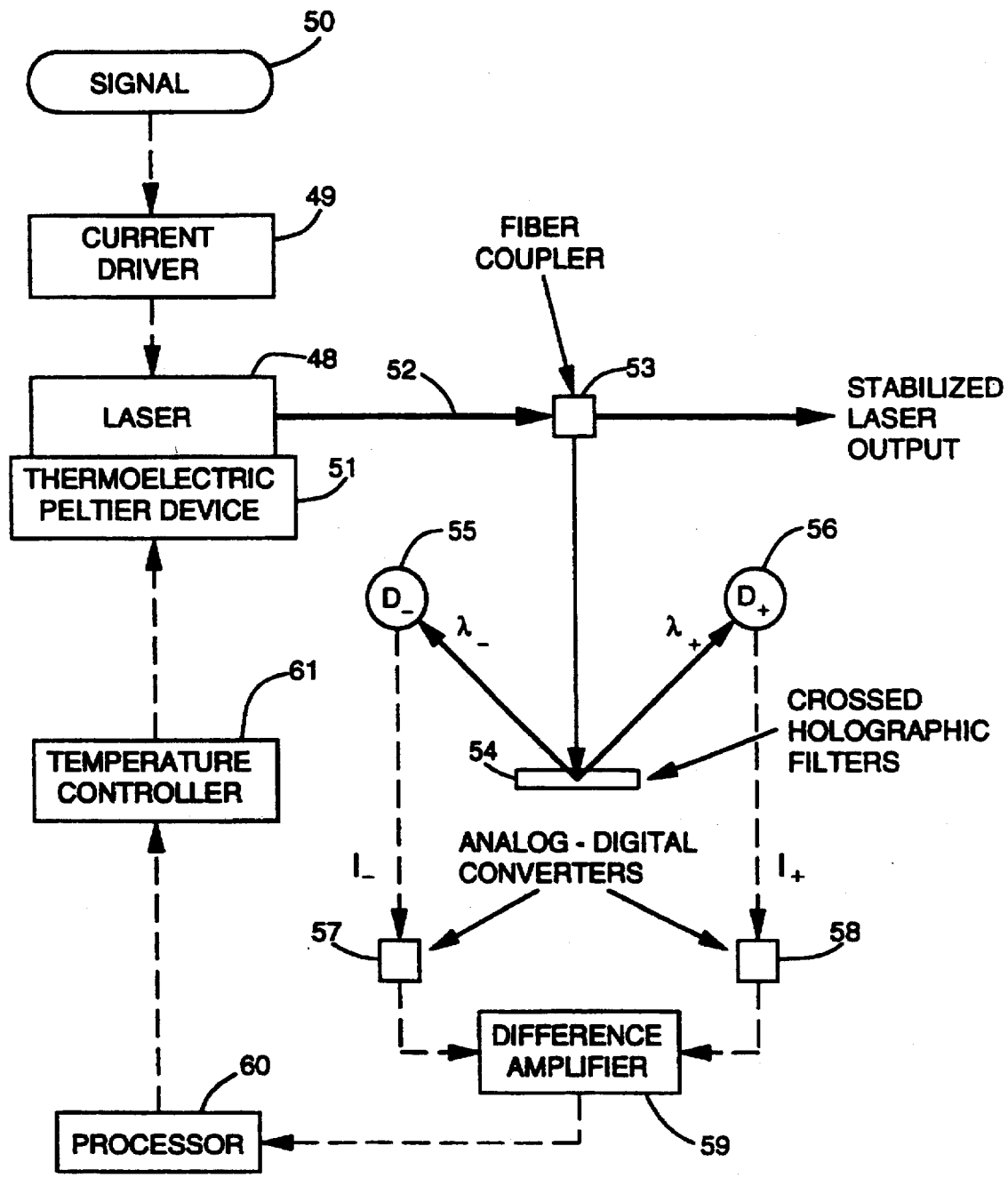
FIG. 11 is a schematic drawing illustrating a DFB laser suitable for application in telecommunications using the crossed-filter wavelength stabilization method.

FIG. 11 illustrates a DFB laser 48 of the type used for telecommunications sources using the crossed filter wavelength control system as set forth in this invention. The DFB laser 48 is modulated through its current driver 49 by a high speed analog or digital signal source 50. The DFB laser 48 is mounted on a thermoelectric Peltier device 51 for temperature control of its output wavelength. The output is fed into an optical fiber pigtail 52 and split by the coupler 53 into the output beam and a lower power sample beam directed to the crossed filters 54. The crossed filters 54, comprised of volume holographic gratings in a photorefractive or other suitable medium, are also temperature controlled for wavelength accuracy and direct their reflections to their respective detectors.

The output signals from the detectors 55 and 56 are digitized by analog-to-digital converters 57 and 58 and sent to the difference/normalizing amplifier 59, where the difference between the two signals gives a direct quantification of the magnitude and direction of the wavelength deviation from the intersection of the two filter response curves. This difference signal is used by the wavelength control system, comprised of a processor 60 and temperature controller 61 to adjust the temperature of the laser 48 until the laser 48 is on band and therefore the difference signal becomes zero. If operation at a slightly shifted wavelength from the intersection point is desired, an offset algorithm can be designed into the control system as described above.

The response of a DFB semiconductor laser and holographic filter to amplitude shift keying (ASK) modulation of the laser input current, as would be required for telecommunications applications, was investigated in a numerical modeling study. The laser output power spectrum and holographic filter response as functions of various sinusoidal and digital ASK modulation parameters were computed to determine the amount of loss in signal power and distortion in the modulation envelope due to the frequency chirping of the laser. The study showed that relatively low losses in the laser signal power spectrum (i.e., approximately 1 to 2 dB) and distortions in the amplitude modulation were experienced with a 1 Å bandwidth holographic filter at data rates of up to 6 Gbits/sec. This showed that the chirp in a DFB laser under high speed modulation will not shift its wavelength sufficiently beyond the bandwidth of the holographic filters used in these embodiments to pose a significant problem.

In a variation of the telecommunications source laser shown in FIG. 11, the DFB laser 48 can be replaced by a current-tuned DBR laser. The temperature controller 61 and thermoelectric cooler 51 are still used to maintain the device at a constant temperature. The difference signal from the processor 60 is used to control the wavelength of the laser 48 through current, which changes the index of refraction of the Bragg reflector substrate and therefore the Bragg conditions of the reflector. Also, in the case of the DBR laser, an external modulator is used instead of directly modulating the driving current as is commonly done in the DFB laser.

Although tuning by the use of temperature control of a DFB laser is principally discussed in this specific example, other tuning techniques can also readily be employed, dependent on the laser. Some examples of these are the use of voltage control, motor driven servo actuators, and electrically-tuned wavelength selectors for such lasers as tunable dye, grating-tuned external cavity semiconductor, and solid state lasers. The use of a current-tuned DBR laser has also been discussed above.

OPTICAL FEEDBACK FOR EXTERNAL CAVITY LASERS

In the previous examples, the volume hologram reflection grating filter was used to generate a signal for feedback into a control system to maintain the wavelength of any of a number of laser types at a constant wavelength. In the following embodiment of this invention, optical rather than electrical signal feedback is used to achieve the same goal of stabilizing the output wavelength of a laser with a volume hologram as the wavelength standard. The volume hologram is used as a wavelength selective reflector for a laser cavity to generate optical feedback into the gain medium to generate the lasing action at only the desired wavelength. Any gain medium, provided the holographic mirror has sufficient reflection so the optical gain exceeds the loss in the system, can be used in this embodiment. For semiconductor lasers, simple Fabry-Perot lasers are used as the gain media in an external cavity configuration, with the holographic reflector serving as the external mirror.

Figure 12:
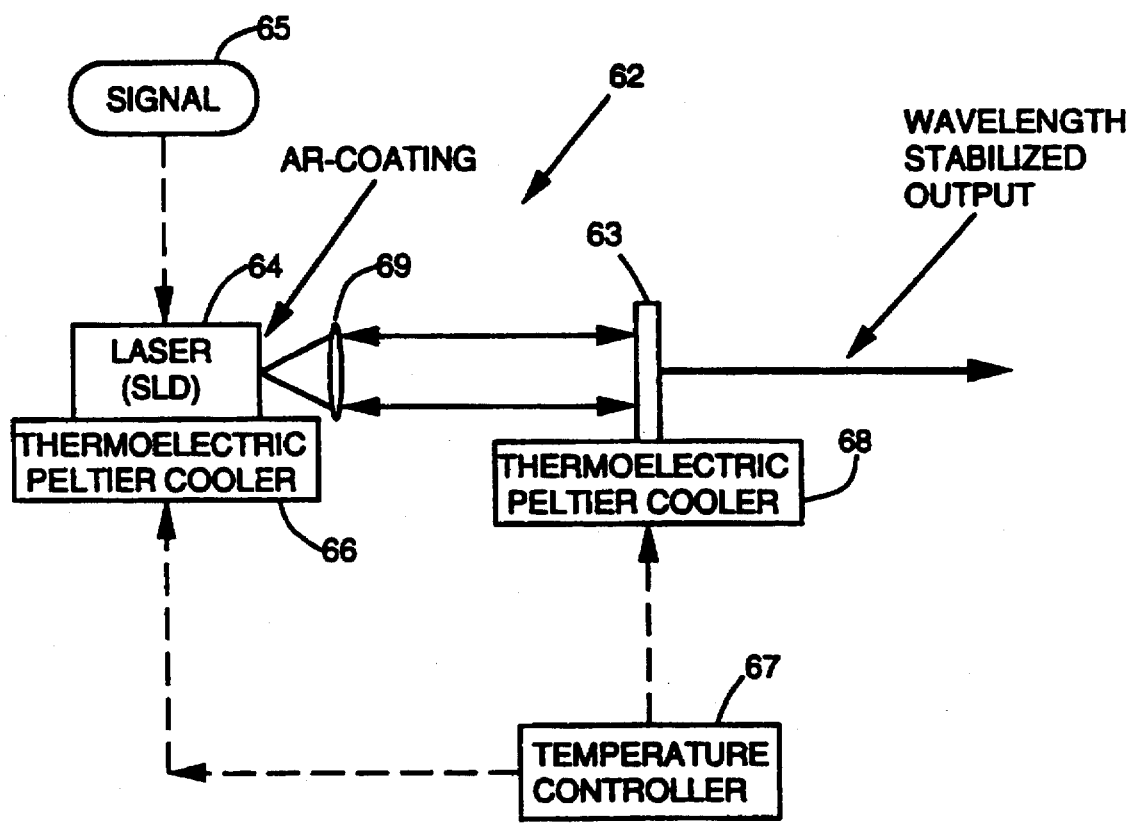
FIG. 12 is a schematic diagram of a volume hologram external cavity semiconductor laser.

FIG. 12 illustrates the components of an external cavity laser 62 according to the present invention. A photorefractive material having a volume hologram reflection grating 63 is used as an end mirror of the external cavity, wherein the volume hologram reflection grating 63 is Bragg-matched to the desired wavelength of operation. In one example, the photorefractive material comprises a 2 mm thick, 0.05% Fe-doped LiNbO$_3$ crystal with an anti-reflection (AR) coating on one facet.

A laser diode 64, modulated by a signal source 65, is used as the gain medium for the external cavity laser. In one example, a Toshiba TOLD 9215 visible laser diode 64 is used as the gain medium. The laser diode 64 is mounted on a heat sink coupled to a thermoelectric Peltier cooler 66 operated by a temperature controller 67. The temperature controller 67 also controls a second thermoelectric Peltier cooler 68 for the volume hologram reflection grating 63. Temperature control is used to avoid temperature dependent drift in the grating 63 wavelength, which is on the order of 1 Å per 30° C. when the photorefractive material is a LiNbO$_3$ crystal. In addition, temperature control can be used to fine-tune the output wavelength of the external cavity laser 62 by changing the center wavelength of the holographic mirror formed by the gratings 63 in the photorefractive crystal.

Normally, the surface of the laser diode 64 is AR-coated so that it is a superluminescent diode (SLD), thereby reducing the Fabry-Perot modes to zero. However, lasers with high quality, i.e. zero reflection, AR-coatings have been difficult to obtain. If the laser diode 64 is not coated for zero reflection, Fabry-Perot modes will appear as well as for high driving currents. In these cases, the laser must be operated at be the threshold, which limits the output power.

The laser diode 64 in this example is coated for 90% reflection at one facet and 10% reflection at the other. The output from the 10% reflectivity side is directed to the holographic grating 63 in the photorefractive material, where it is retro-reflected at normal incidence back into the laser diode 64. This optical feedback from the volume hologram reflection grating 63 results in oscillation forming between the external reflector and the high reflectivity facet of the laser diode 64, with any oscillation between the two laser diode 64 facets being suppressed by the AR coating.

The output from the low reflectivity facet of the laser diode 64 is collimated by the aspheric objective lens 69 and directed to the holographic grating 63 in the photorefractive material, which acts as the external reflector for the external cavity laser 62. The grating 63 in the crystal reflects a narrow spectral band of light around the chosen wavelength back to the laser diode 64 to generate feedback, while transmitting all out of band radiation. A high reflectivity grating 63 (on the order of 20% or greater) with sufficiently low absorption loss is used to obtain sufficient feedback in the cavity for oscillation. In the example described above, the objective lens has a 4.5 mm focal length and the crystal containing the holographic grating 63 is located 6 inches from the laser diode 64.

The high reflectivity facet of the laser diode 64 and the narrow bandwidth mirror formed by the grating 63 comprise the external cavity within which oscillation occurs for the laser 62. Because of the narrow spectral bandwidth (on the order of 0.5 Å for a 2 mm thick grating with an incident illumination of approximately 600 nm), the output of the external cavity laser 62 can be controlled to a very high degree of accuracy. The lasing wavelength of the external cavity laser 62 is only dependent on the wavelength of reflection of the holographic grating 63 in the crystal, which acts as the external wavelength standard. Therefore, the wavelength of operation is independent of the Fabry-Perot laser diode 64, so that when replaced with a different laser 64, there is no change to the output wavelength of the external cavity laser 62.

Figure 13:
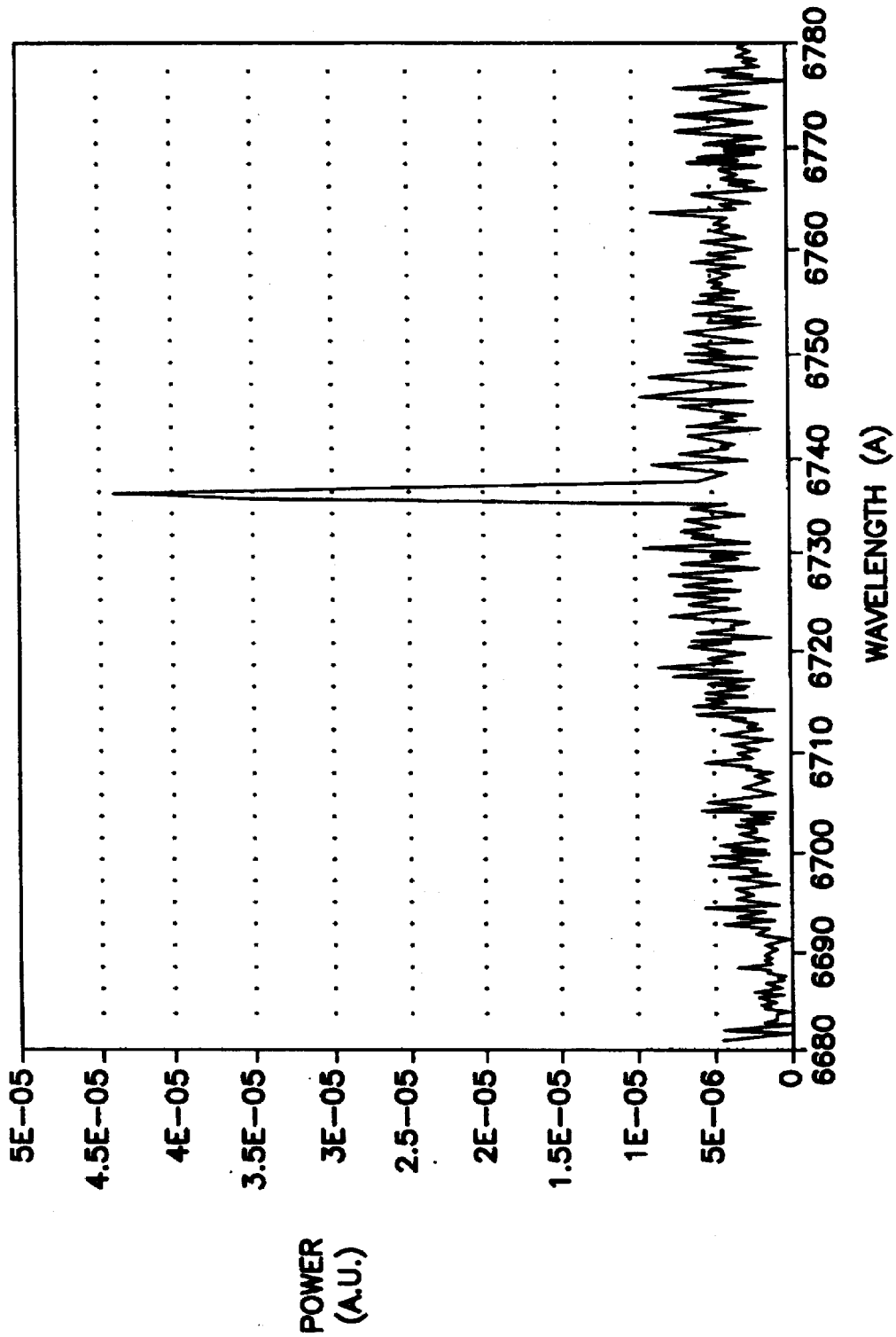
FIG. 13 is a spectrum graph of a holographic external cavity laser using a Toshiba TOLD 9215 visible laser diode with a volume hologram reflector at 6736.4 Å and the laser operating at low driving current (approximately 31 mA) and without active temperature control.
Figure 14:
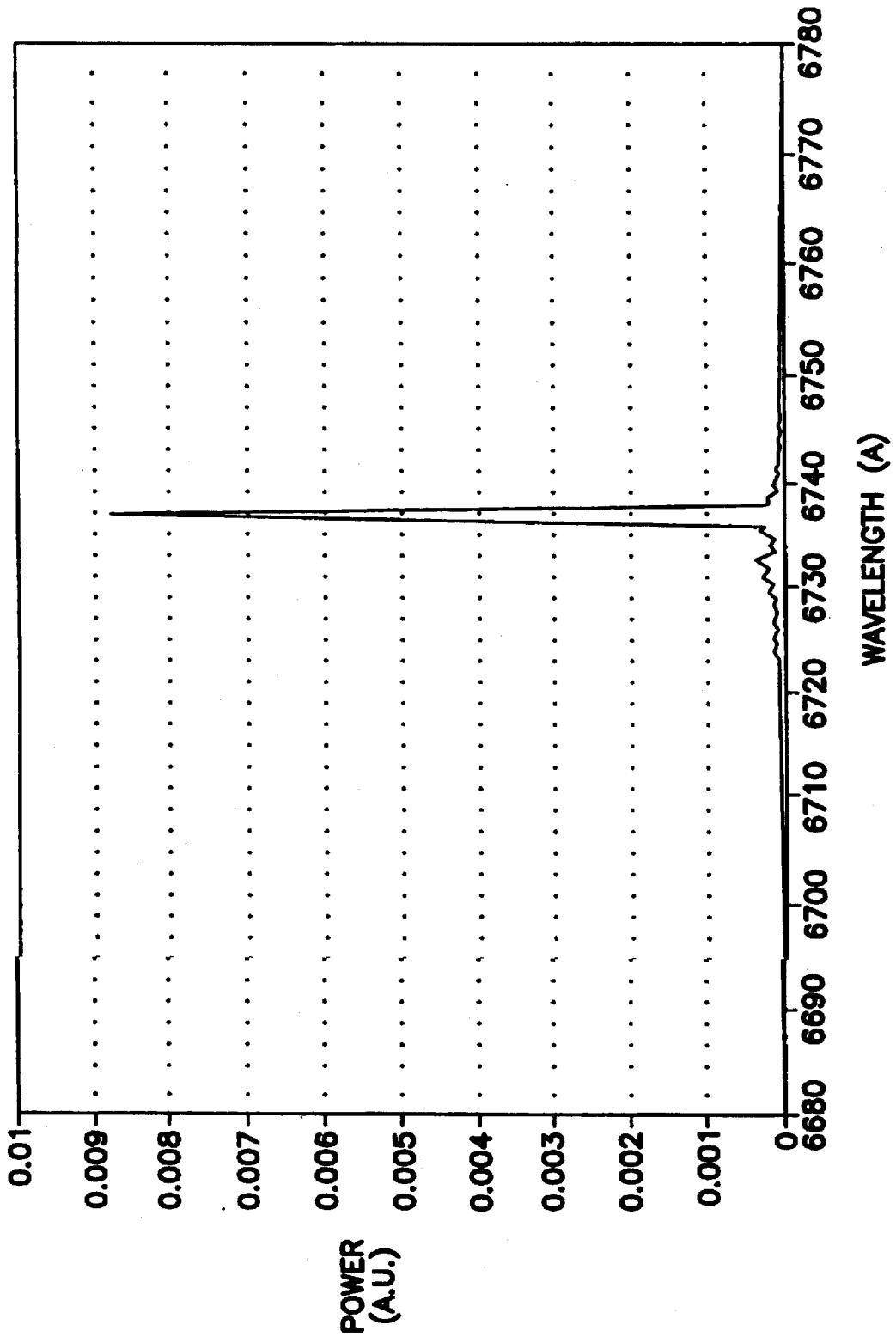
FIG. 14 is a spectrum graph of the external cavity visible laser diode of FIG. 12 at a higher driving current (37 mA)

Plane gratings 63 for the external cavity reflector are written using a direct writing method of illuminating the crystal with counter-propagating beams of the desired wavelength, provided the desired wavelength of operation is within the photorefractive sensitivity range of the crystal. Alternatively, the laser medium itself can be used to write the grating to ensure they are self-aligned. This method requires that sufficient intensity be obtained from the laser 64 to write high efficiency, high quality holograms within a reasonable exposure time. For IR holographic mirrors, the method is described by G. A. Rakuljic and V. Leyva, U.S. patent application Ser. No. 07/991,571, (1992) supra, where off-axis beams at shorter wavelengths are used to write a grating 63 Bragg-matched for normal incidence reflection at the desired wavelength. FIGS. 13 and 14 are graphs illustrating the output wavelength of the holographic grating external cavity laser as measured by a spectrum analyzer for driving currents of 31 mA (FIG. 13) and 37 mA (FIG. 14). As shown in the graphs, the laser output is single mode, and its wavelength remains constant at 6736.6 Å within the bandwidth of the holographic grating for a wide range of driving currents (and therefore output powers). In addition, when the laser diode is mounted on a thermoelectric cooler operated by a temperature controller and the temperature varied, the output remains within the hologram bandwidth of less than 0.5 Å.

Figure 15:
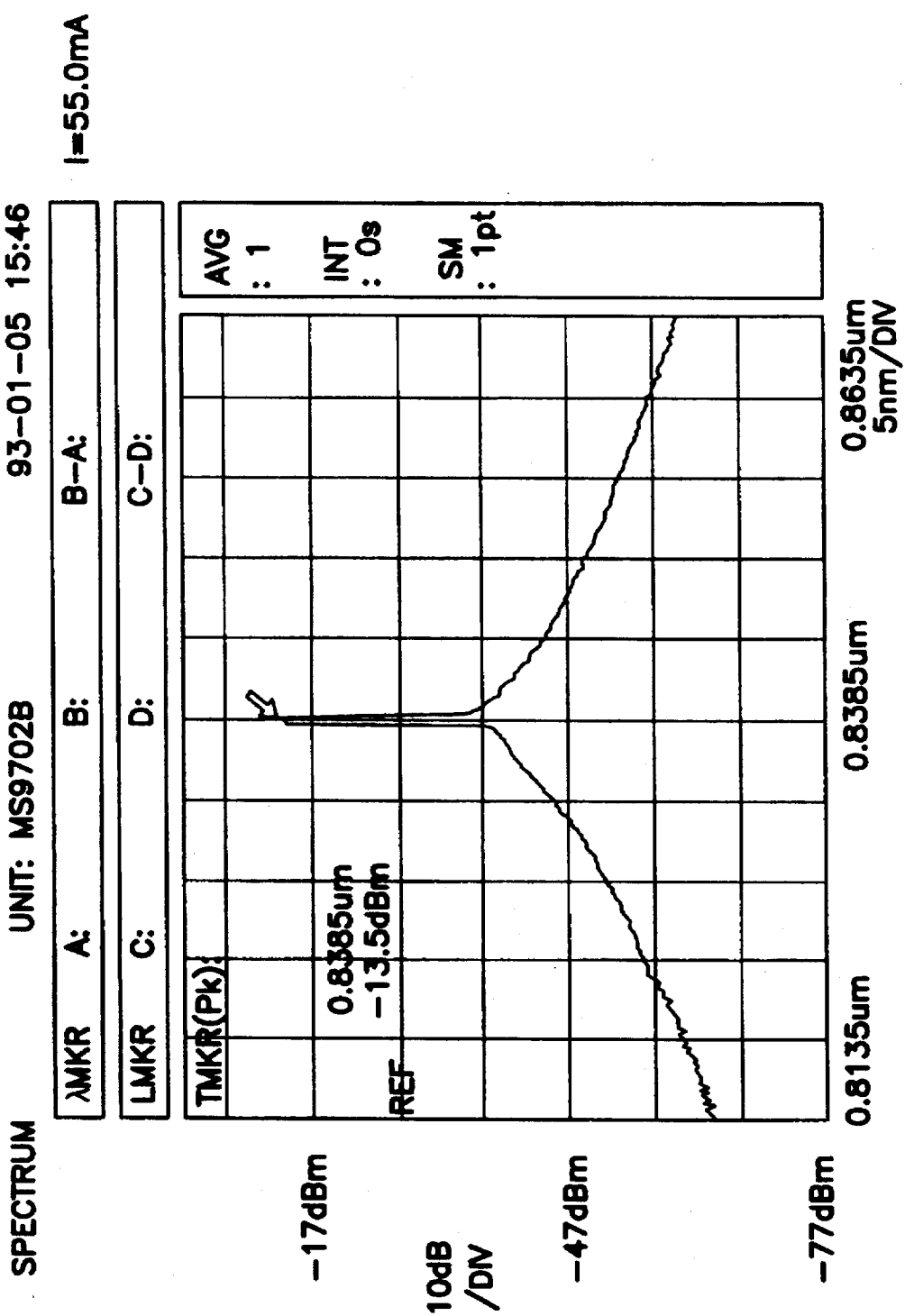
FIG. 15 is a spectrum graph of the holographic external cavity laser at 840 nm, where the reflector was written in a 0.15% Fe-doped $LiNbO_3$ crystal using a Ti:Sapphire laser.

The holographic external cavity laser illustrated in schematic form in FIG. 12 has been demonstrated at wavelengths as long as 840 nm, using a LiNbO$_3$ crystal with especially high dopant concentration for increased near IR sensitivity to store the gratings. A Ti:Sapphire laser was used to write the grating in a 0.15% Fe-doped LiNbO$_3$ crystal with AR coatings using the direct writing method. This crystal was coupled with an AR-coated 840 nm laser from Spectra-Diode Laboratories, and the spectrum of the resulting external cavity laser is shown in FIG. 15.

Figure 16:
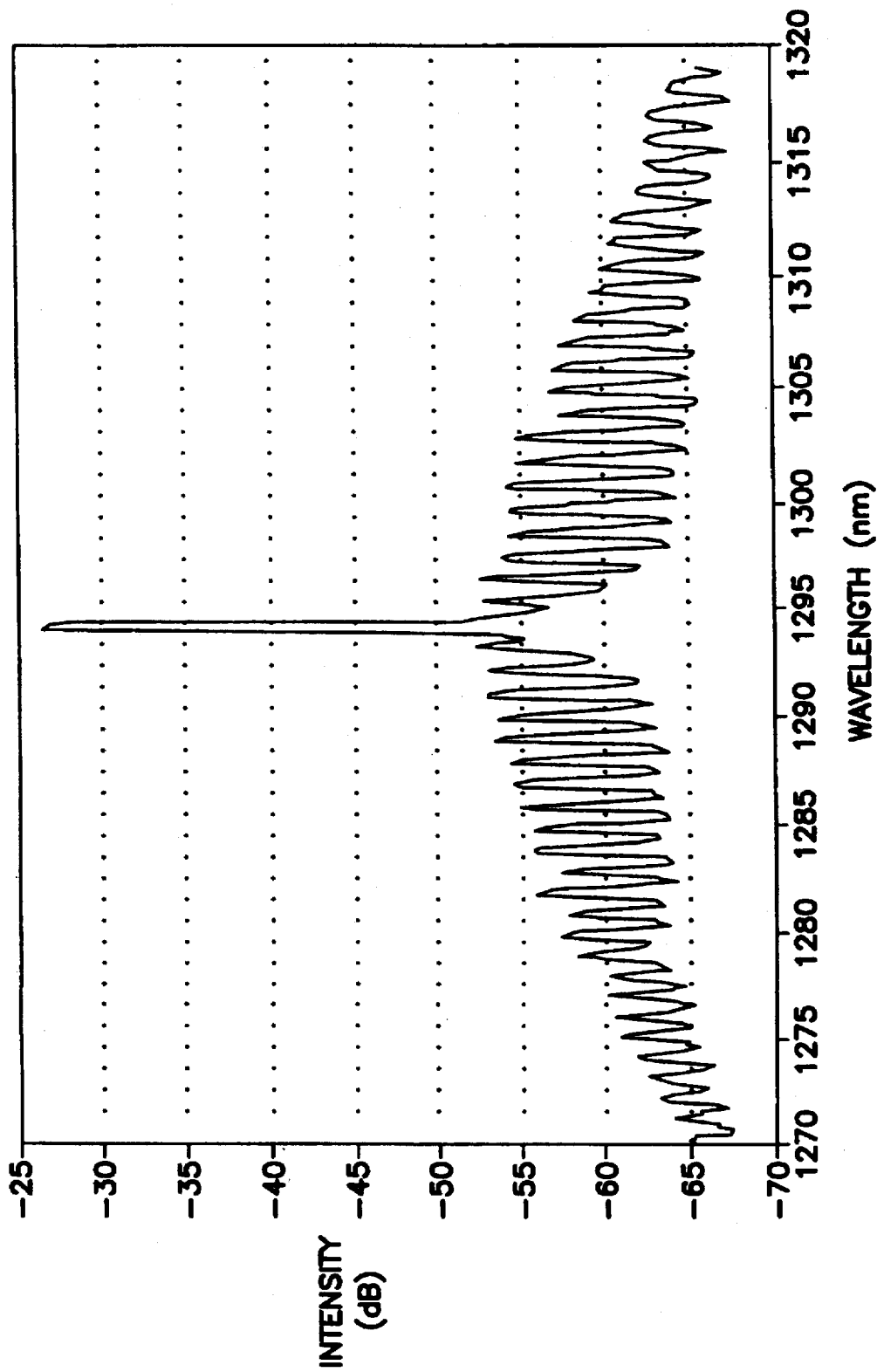
FIG. 16 is a spectrum graph of a holographic external cavity laser operating at 1.3 µm using an infrared holographic grating written using the method described in the parent applications, supra.

FIG. 16 is a spectrum graph of a holographic external cavity laser operating in the 1.3 µm band using infrared holographic gratings written with the methods described in the parent patent applications, supra, using 488 nm light incident from the side faces of the crystal to obtain a retro-reflecting grating for 1.293 µm. The spectrum graph is plotted on a logarithmic scale to show the sidelobe levels of the laser output, which are at least 25 dB below the peak amplitude. As in the visible laser spectrum graphs of FIGS. 13 and 14, the laser shows single mode operation, and its output wavelength was found to be independent of driving current.

Figure 17:
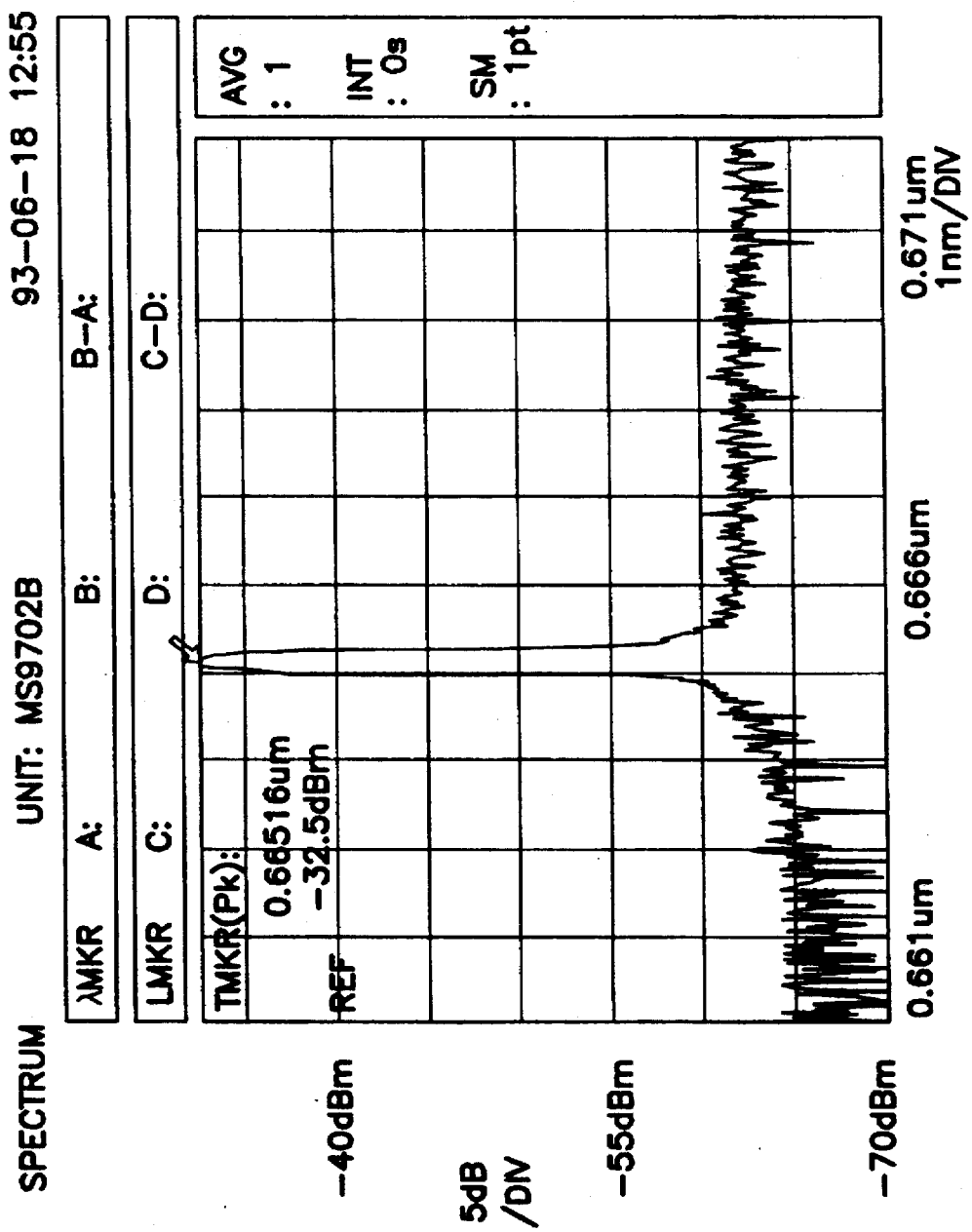
FIG. 17 is a spectrum graph of a 665 nm holographic external cavity laser using a laser with an improved AR-coating on its facet.

A nominally 670 nm Fabry-Perot semiconductor laser with an improved AR-coating was recently used to fabricate an external cavity laser demonstration. This laser was coated at the facilities of the laser diode group at the National Institute of Standards and Technology in Boulder, Colo. This coating was of sufficiently high quality that the Fabry-Perot modes were reduced to zero. The spectral graph of the output of this external cavity laser is shown in FIG. 17.

Since the operating wavelength of Fabry-Perot lasers can be specified to very high accuracy using the methods set forth in this embodiment of the present invention, inexpensive, compact, high wavelength accuracy sources can be constructed. The accuracy of the output wavelength allows these lasers to be used as closely spaced sources for WDM, secondary wavelength standards for instrumentation, and other applications requiring low cost, precision wavelength coherent sources. Since the operating wavelength is determined by a device external to the laser itself, standardized wavelength sources can be produced in quantity despite the slight variations in operating points for individual Fabry-Perot lasers.

Variations of the holographic external cavity laser just described can be used in a variety of related embodiments. The Fabry-Perot semiconductor laser can be replaced with any laser gain medium with a broad gain spectrum where accuracy in the output wavelength is desired, such as with a tunable dye or solid state gain medium. As in the holographic external cavity semiconductor laser, the wavelength of operation of these lasers is defined by the holographic external cavity mirror. However, since the semiconductor laser has a very high gain coefficient, lower reflectivities for the external cavity reflector often suffice, whereas much higher reflectivities may be required for other gain media such as solid state crystals or gas plasma tubes with comparatively lower gain coefficients.

The operating wavelength of the external cavity laser can be shifted slightly by detuning the center wavelength of the holographic grating. In one method, the temperature controller 67 shown with the crystal in FIG. 12 is used to vary the temperature of the medium containing the grating, which changes the grating period and therefore the reflection wavelength. In another method, the crystal is coated with a transparent conductive layer and an electric field applied to change the dimensions of the crystal through the photovoltaic and piezoelectric effects. Either of these methods change the grating period and therefore the Bragg conditions for reflection, and the external cavity laser is forced to operate at the new wavelength.

Figure 18:
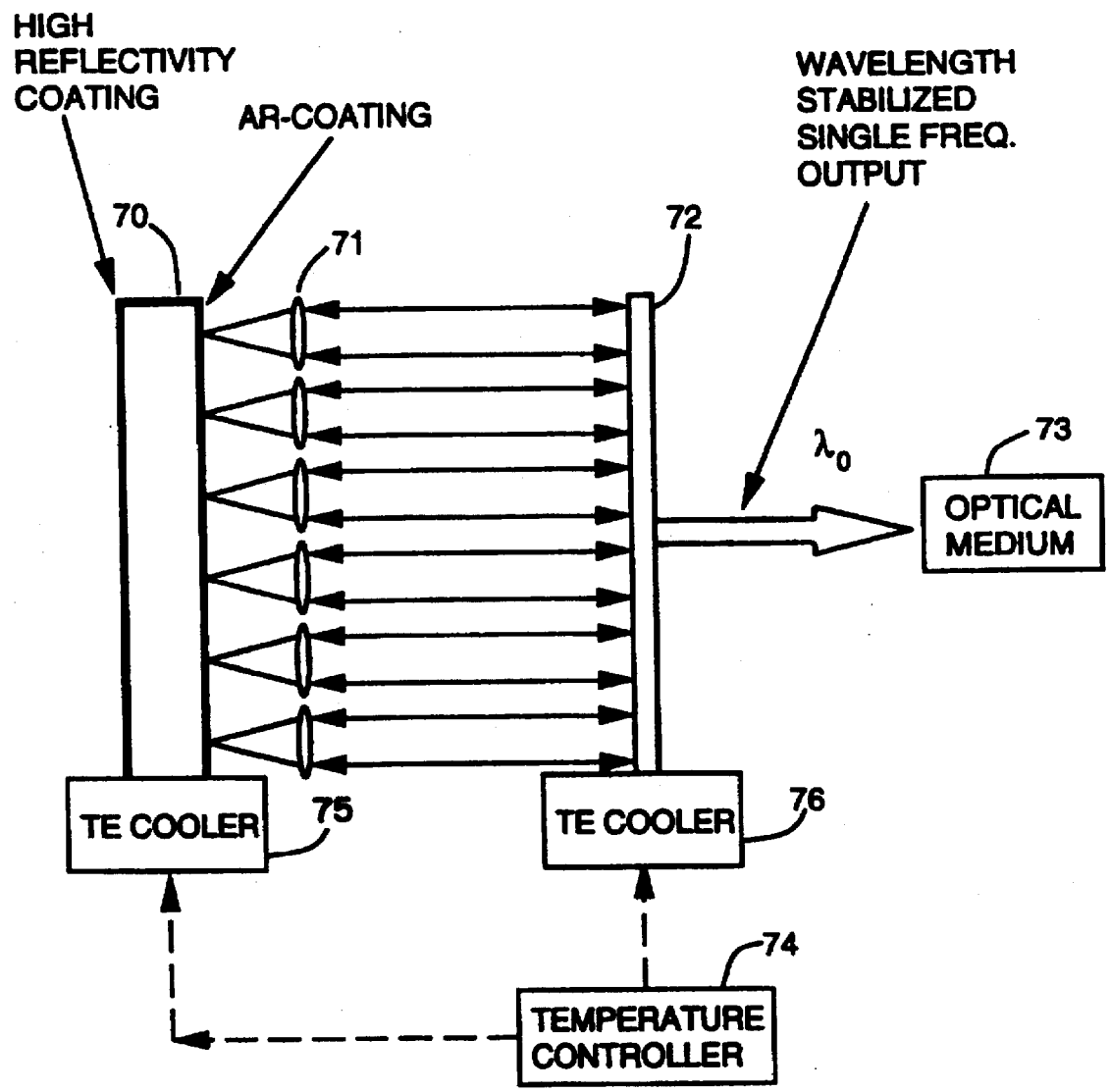
FIG. 18 is a schematic diagram of a holographic grating external cavity laser array, where the individual lasers are locked to the same wavelength using a single holographic grating for high power applications such as pumping solid state lasers or optical amplifiers.

In addition, other semiconductor laser types can benefit from this technology. One example is with an array of conventional or surface emitting semiconductor lasers (SELs), shown in FIG. 18. The beams from each laser in the array 70 are collimated by a lenslet array 71 and reflected off a single holographic grating 72 to lock the outputs of all the lasers to a single wavelength $\lambda_0$ so they behave as a single laser for pumping the optical medium 73. A temperature controller 74 and thermoelectric coolers 75, 76 are used to keep the laser array 70 and photorefractive crystal 72 at their desired temperatures. In addition, the temperature of the photorefractive crystal 72 can be varied by the thermoelectric cooler 76 to change its operating wavelength.

In this way, it is possible to obtain a higher output power than with a single laser for use in applications requiring high power, such as for pumping optical amplifiers and solid state lasers. The accurate output wavelength of this external cavity laser array enables all of its output power to be concentrated at the absorption line of the amplifier or laser gain medium, increasing the efficiency of the pumping process. The use of a SEL is particularly suited for this application because of its broad area and larger active area than conventional semiconductor laser arrays.

Figure 19:
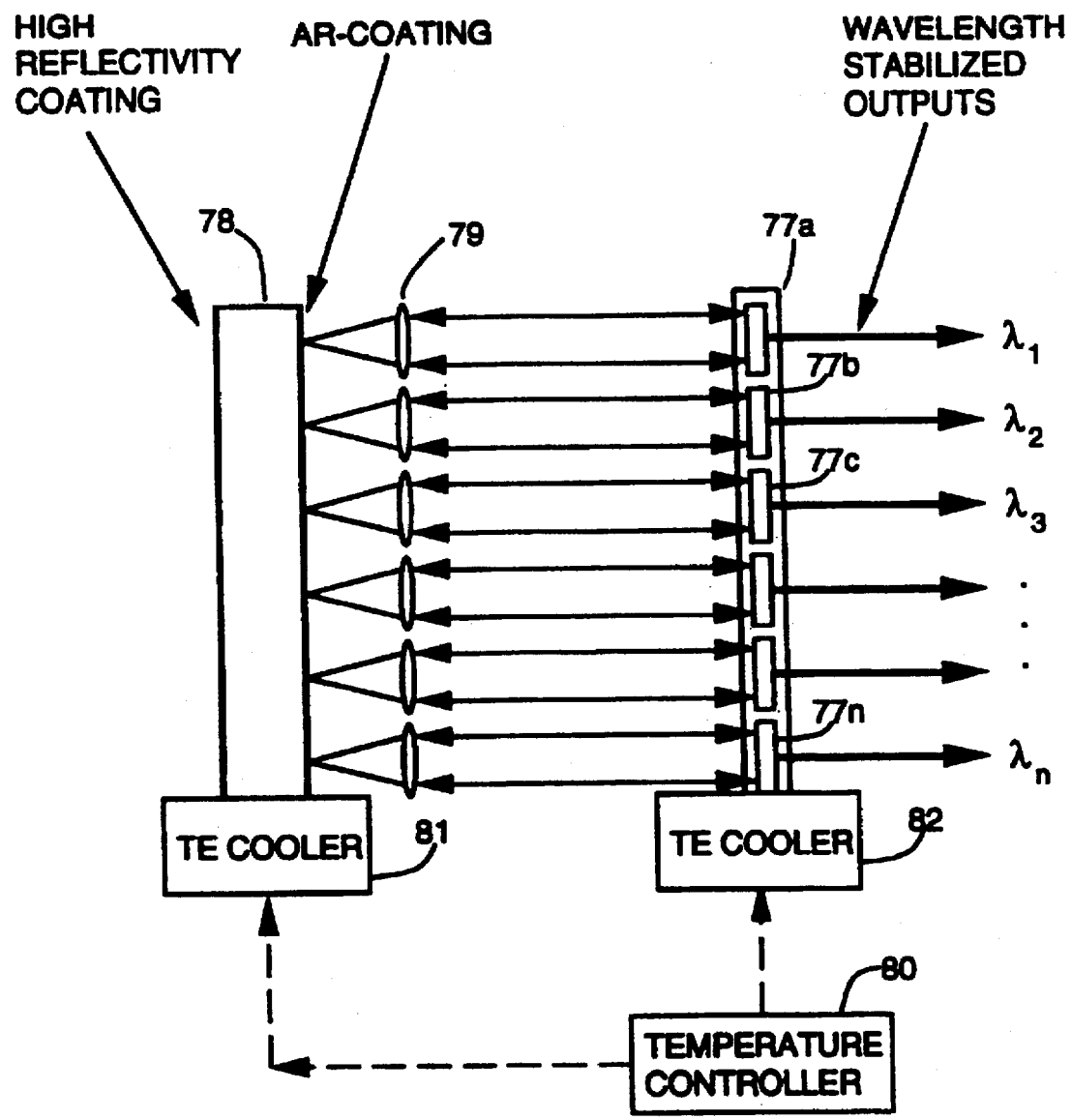
FIG. 19 is a schematic diagram of a holographic grating external cavity laser array, where the individual lasers are locked to a different wavelength by using an array of individual holographic gratings, each corresponding to the desired wavelength of that laser.

FIG. 19 illustrates an alternative architecture for a holographic external cavity laser array, wherein individual holograms 77a, 77b, . . . , 77n at different wavelengths are used with the AR-coated laser array 78 to produce an array of accurate wavelength sources, each at a different wavelength. The lenslet array 79 collimates the light from each laser onto its respective grating, 77a, 77b, . . . , 77n, and the temperature controller 80 and thermoelectric coolers 81 and 82 are used to regulate the temperature of the laser array 78 and gratings 77a, 77b, . . . , 77n. This embodiment of the external cavity laser array has application as a source for WDM communications systems, where all of the source lasers required for the system are grown on a single wafer. Another application is as a readout source of a wavelength multiplexed optical memory where individual semiconductor lasers are used to address a specific "page" of data stored at a given wavelength.

APPLICATIONS

Figure 20:
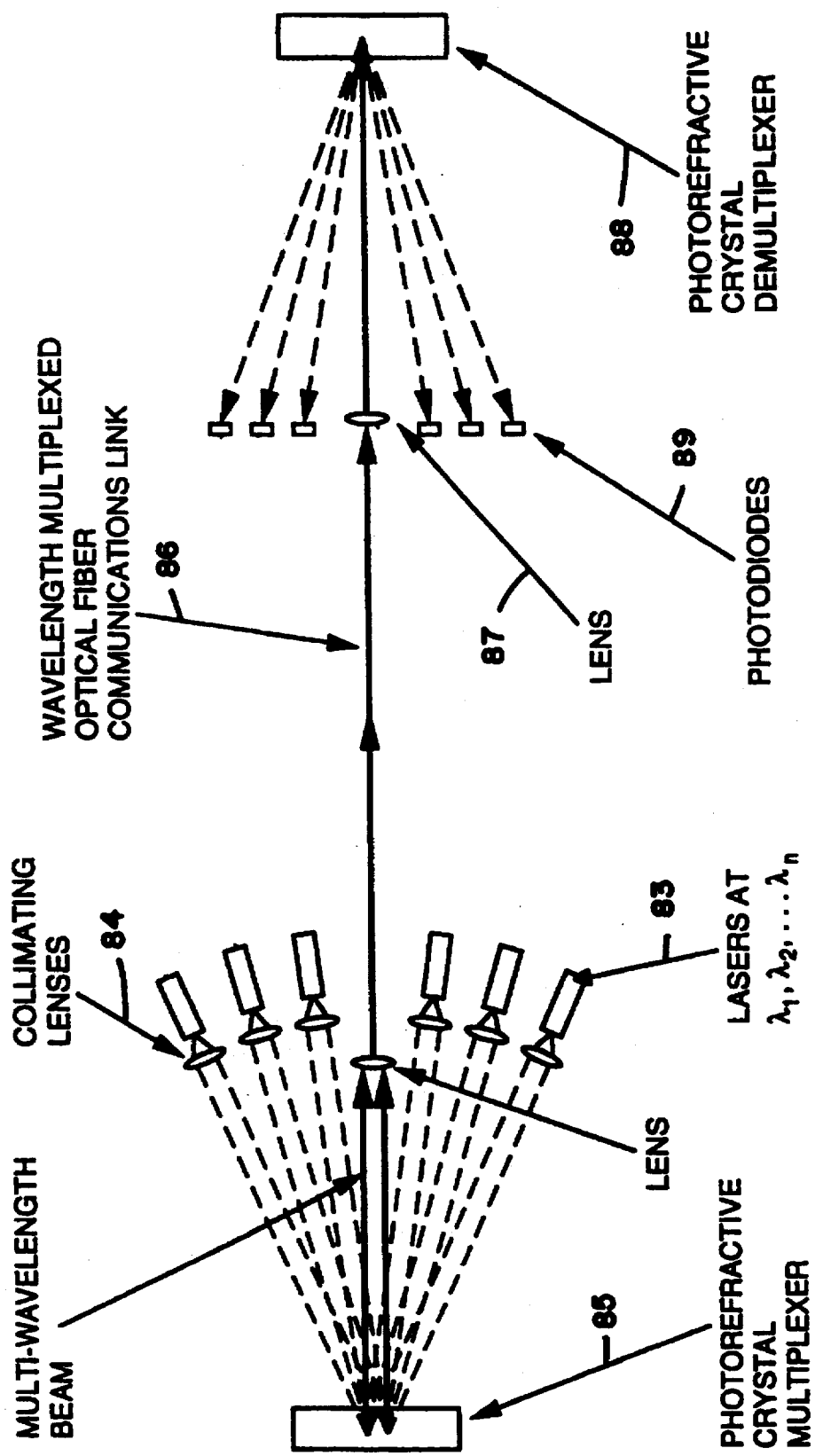
FIG. 20 is a schematic diagram of a wavelength division multiplexing (WDM) system using the wavelength stabilized laser as an accurate wavelength source.

FIG. 20 illustrates an application of the wavelength stabilized laser in a WDM optical fiber communication system. The modulated outputs of the lasers 83 operating at wavelengths $\lambda_1, \ldots \lambda_n$, respectively, are collimated by lenses 84 and combined by a multiplexer 85. The multiplexer 85 can be of the conventional type or a holographic grating device to reduce coupling loss. The multi-wavelength beam is coupled through a fiber coupler to a length of optical fiber 86. At the end of the fiber, a second lens 87 is used to send the beam to a demultiplexer 88, where high spectral resolution holographic gratings are used to separate each wavelength channel and direct these beams at different angles onto their separate photodetectors 89.

Semiconductor lasers using the wavelength stabilization methods described in this invention are particularly useful for WDM telecommunications systems using volume holographic technology to space channels considerably closer than is possible in the current art. In current WDM architectures, the wavelength accuracy of the semiconductor laser sources is the limiting factor that restricts channel spacing. In most cases, the multiplexed channels must be in separate bands, i.e., 1.3 μm and 1.55 μm. With careful selection of DFB lasers, the uncertainty can be reduced to about 40 Å, but this still does not account for drift due to aging and other factors. The stabilization method set forth in this invention uses an external wavelength standard that the laser is locked to, allowing arbitrarily close channel separation, not accounting for chirp and other effects of high speed modulation.

Either of the two major approaches to laser wavelength stabilization, the electrical feedback scheme or the external cavity (optical feedback) method described in this invention, are possible sources for the WDM application. The electrical feedback approach, however, is the preferred first embodiment because of its simplicity in development and lowest technical risk. The DFB laser will be temperature-controlled and coupled to a holographic filter or crossed-filter pair, which send their signals to the detectors and wavelength control system. The output is fiber-coupled to the utilization device. The wavelengths are set so chirp and other FM effects from high speed modulation do not spill over into adjacent channels. The channel spacing is limited now by the bandwidth occupied by a DFB laser with high speed modulation, not by the inaccuracies of the laser output wavelengths.

Figure 21:
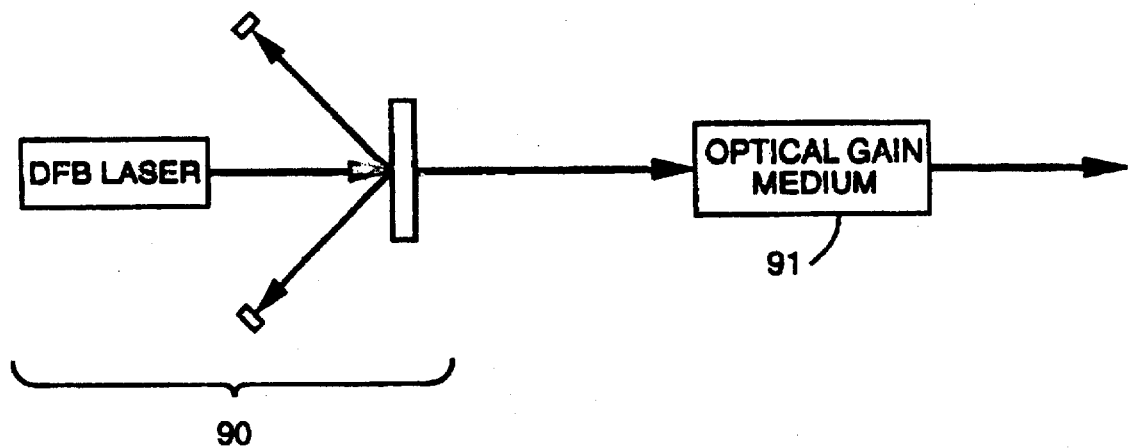
FIG. 21 illustrates an application of the holographic feedback accurate wavelength laser as the pump for an optical medium such as a solid state laser or optical amplifier for improved pumping efficiency.

FIG. 21 illustrates application of an accurate wavelength laser 90 using the feedback techniques set forth in this invention to pump an optical medium 91, such as Er-doped optical fiber amplifiers, Er-doped fiber lasers, or diode-pumped solid state lasers, where the absorption band of the active gain medium is extremely narrow. By using an accurate laser with a volume hologram external wavelength standard operating at the exact wavelength of the absorption peak, all of the laser energy is applied to the pumping medium, thereby increasing the pumping efficiency. In addition, these lasers are well suited as secondary wavelength references for test equipment such as interferometers or sources for spectroscopy, which also require sources with high wavelength accuracy.

Figure 22:
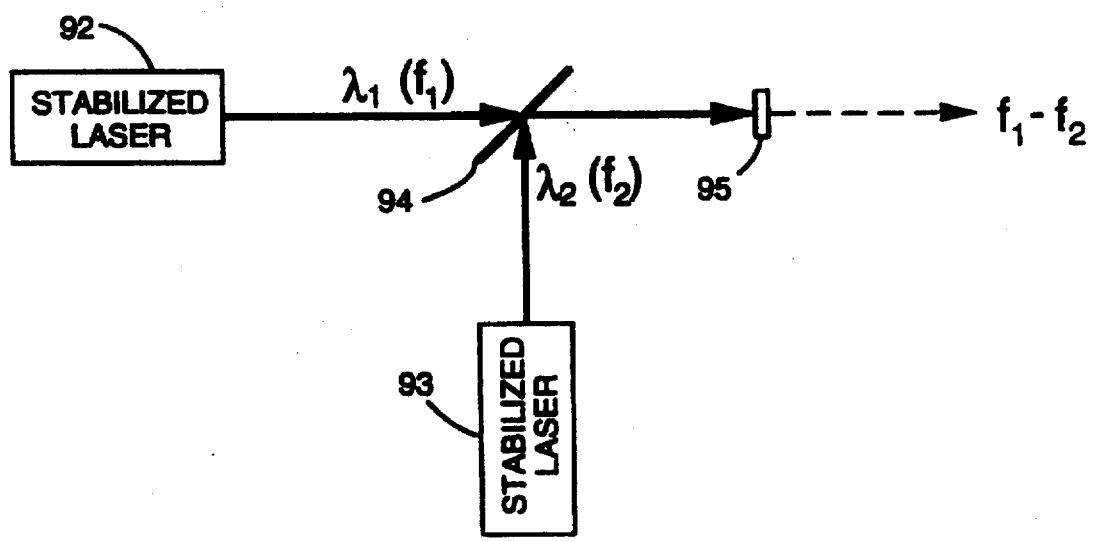
FIG. 22 illustrates a method for microwave or millimeter wave signal generation using two lasers operating at slightly different wavelengths.

FIG. 22 illustrates a method for microwave or millimeter wave signal generation using two volume hologram stabilized lasers 92 and 93 operating at slightly different wavelengths. In this embodiment, the two lasers 92 and 93 operating at known wavelengths $\lambda_1$ and $\lambda_2$ (corresponding to frequencies $f_1$ and $f_2$) are optically heterodyned using a beamsplitter 94 and directed to a detector 95. The beam incident on the detector 95 oscillates with a beat frequency $f_1-f_2$, which is an approximately 3 mm wavelength signal when $\lambda_2-\lambda^1=5$ Å and the lasers 92 and 93 operate in the 1.3 μm band. Moreover, the frequency of this output signal can be varied by tuning the operating wavelength of one or both of the lasers 92 and 93.

Typically, the mixed output will be in the optical frequency portion of the electromagnetic wave spectrum, but it may also be in the millimeter or centimeter wavelength range of the microwave spectrum. Such results are achievable by virtue of the accuracy of the wavelength stabilization and the capability for further tuning. The mixed signal may further be modulated by a suitable electronic source, such as one utilizing the piezoelectric effect.

Figure 23A:
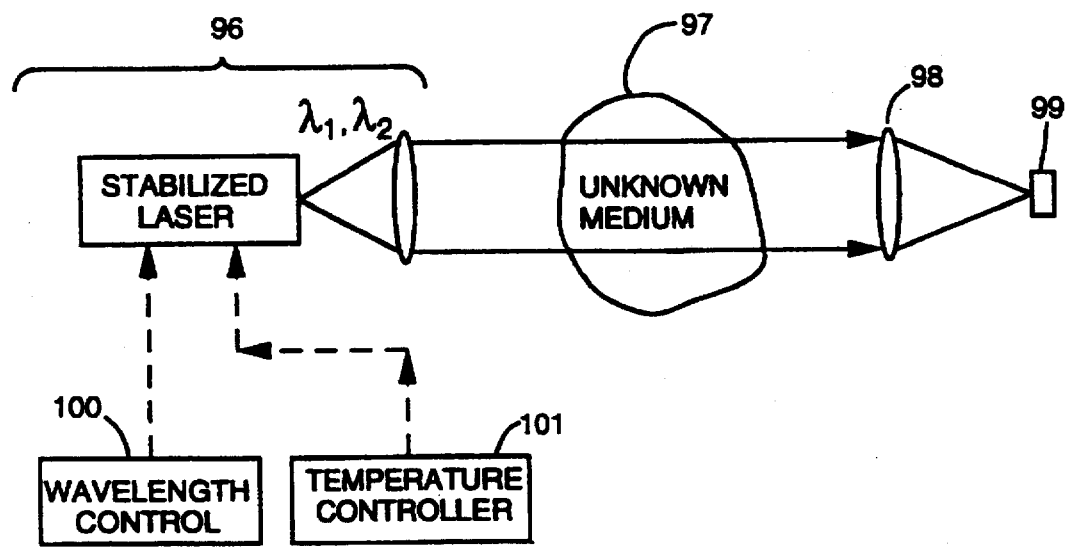
FIGS. 23a and 23b are diagrams of differential absorption spectroscopy apparatus using the volume hologram stabilized laser as an accurate wavelength source, where the approaches involve use of a laser with multi-wavelength capability (FIG. 22a) and use of two lasers at known, fixed wavelengths (FIG. 22b).

FIG. 23a illustrates another application of this laser, which is as an accurate, detunable source for differential absorption spectroscopy. A single holographic grating stabilized laser 96 with a detuning capability is used to pass at slightly different wavelengths (at $\lambda_1$ and $\lambda_2$) through an unknown medium 97, focusing lens 98, and onto a detector 99. Measurements are made in succession at shifted wavelengths through the same area of the sample. The laser wavelength controller 100 is used to set the output to $\lambda_1$, then $\lambda_2$, and the temperature controller 101 ensures stable operation by keeping the laser at a constant temperature. Although the beam will be positioned at exactly the same spot for both measurements, the disadvantage of this approach is the time interval between measurements.

Figure 23B:
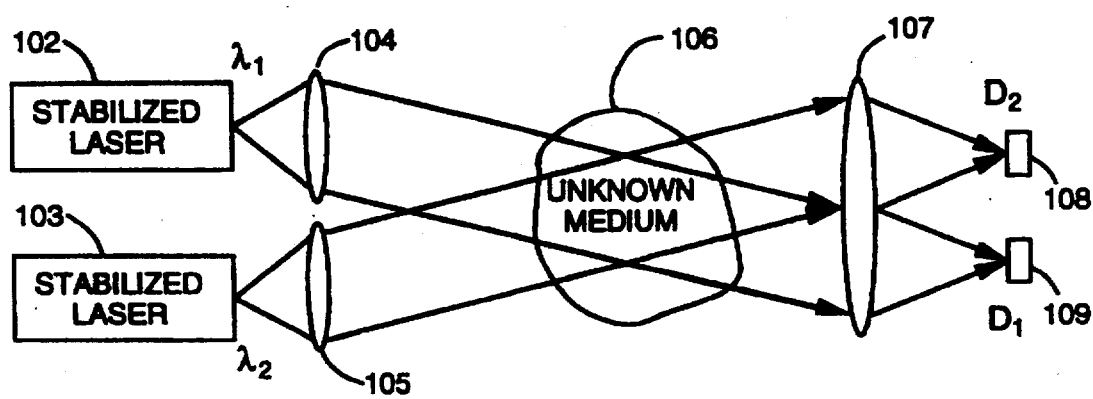

FIG. 23b illustrates a second example, wherein the beams from two different lasers 102 and 103 at known wavelengths $\lambda_1$ and $\lambda_2$ are collimated by lenses 104 and 105, passed through the unknown medium 106, and focused by the lens 107 onto their individual detectors 108 and 109 to obtain simultaneous absorption measurements. The wavelength differential can be easily changed by adjusting the wavelength of one or both of the lasers 102 and 103 using the control mechanisms discussed above. However, there will be a slightly different path for each beam through the sampled medium.

CONCLUSION

This concludes the description of the preferred embodiment of the invention. In summary, the present invention discloses a laser that utilizes feedback from a volume holographic grating used as a wavelength standard to lock the laser output wavelength to its desired value. This feedback can be non-optical, wherein the holographic filter output is used to actively control the wavelength through an external control mechanism. This feedback can also be optical, wherein a volume hologram reflection grating is used to generate optical feedback into the laser gain.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by its detailed description, but rather by the claims appended hereto.

What is claimed is:

1. A method of stabilizing an optical source's output in a selected wavelength range, comprising the steps of:

generating a beam of electromagnetic wave energy as the output in the selected wavelength range;

filtering the beam using a holographic storage device including at least two reflective diffraction gratings having like response characteristics that intersect at a given wavelength in the selected wavelength range, where at least a portion of the beam is directed onto the diffraction gratings to generate reflections therefrom; and controlling the optical source to alter the beam's wavelength in accordance with relative amplitudes of the reflections from the diffraction gratings.

2. The method as set forth in claim 1 above, where the controlling step comprises the step of directing the filtered beam to a detector to identify the relative amplitudes of the reflections from the diffraction gratings.

3. The method as set forth in claim 1 above, wherein the controlling step comprises the steps of:

deriving a difference signal between the relative amplitudes of the reflections from the gratings;

adjusting an amplitude of the difference signal in accordance with a total power output for the optical source; and controlling the optical source in response to the amplitude of the difference signal.

4. The method as set forth in claim 1 above, further comprising the step of controlling the optical source by varying a temperature of the holographic storage device.

* * * * *

UNITED STATES PATENT AND TRADEMARK OFFICE
CERTIFICATE OF CORRECTION

PATENT NO.  :  5,691,989

DATED         :  November 25, 1997

INVENTOR(S) :  George A. Rakuljic, et al.

It is certified that error appears in the above-identified patent and that said Letters Patent is hereby corrected as shown below:

Column 4, line 9, delete "two" (first occurrence).

Column 5, line 65, "FIGS." should read --FIG.--.

Signed and Sealed this

Sixteenth Day of June, 1998

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

| | | |
|---|---|---|
| PATENT NO. | : 5,691,989 | |
| APPLICATION NO. | : 08/122711 | |
| DATED | : November 25, 1997 | |
| INVENTOR(S) | : George Anthony Rakuljic et al. | |

It is certified that error appears in the above-identified patent and that said Letters Patent is hereby corrected as shown below:

In claim 1, column 18, line 50, add -- volume -- to read -- volume holographic storage --
In claim 1, column 18, line 54, add -- optical source's -- to read -- optical source's beam --
In claim 1, column 18, line 55, delete "diffraction gratings", replace with -- volume holographic storage device --
In claim 1, column 18, line 57, delete "controlling", replace with -- directing the filtered beam back in the direction of --
In claim 1, column 18, line 58, add -- in the optical source -- to read -- the beam's wavelength in the optical source --
In claim 1, column 18, line 59, delete "diffraction gratings", replace with -- volume holographic storage device --
In claim 2, column 18, line 60, delete "The method as set forth in claim 1 above" and replace with -- A method of stabilizing an optical source's output in a selected wavelength range, comprising the steps of: generating a beam of electromagnetic wave energy as the output in the selected wavelength range; filtering the beam using a volume holographic storage device including at least two reflective diffraction gratings having like response characteristics that intersect at a given wavelength in the selected wavelength range, where at least a portion of the optical source's beam is directed onto the volume holographic storage device to generate reflections therefrom; and controlling the optical source to alter the beam's wavelength --
In claim 2, column 18, line 63, delete "diffraction gratings"", replace with -- volume holographic storage device --
In claim 3, column 18, line 60, delete "The method as set forth in claim 1 above" and replace with -- A method of stabilizing an optical source's output in a selected wavelength range, comprising the steps of: generating a beam of electromagnetic wave energy as the output in the selected wavelength range; filtering the beam using a volume holographic storage device including at least two reflective diffraction gratings having like response characteristics that intersect at a given wavelength in the selected wavelength range, where at least a portion of the optical source's beam is directed onto the volume holographic storage device to generate reflections therefrom; and controlling the optical source to alter the beam's wavelength --

UNITED STATES PATENT AND TRADEMARK OFFICE
CERTIFICATE OF CORRECTION

PATENT NO. : 5,691,989
APPLICATION NO. : 08/122711
DATED : November 25, 1997
INVENTOR(S) : George Anthony Rakuljic et al.

It is certified that error appears in the above-identified patent and that said Letters Patent is hereby corrected as shown below:

In claim 3, column 18, line 67, delete "gratings", replace with -- volume holographic storage device --
In claim 4, column 20, line 3, add -- volume -- to read -- volume holographic storage device --

Signed and Sealed this

Sixteenth Day of December, 2008

JON W. DUDAS
*Director of the United States Patent and Trademark Office*